(12) United States Patent
Ishii et al.

(10) Patent No.: US 8,199,516 B2
(45) Date of Patent: Jun. 12, 2012

(54) ELECTRONIC COMPONENT MOUNTING BOARD, METHOD FOR MANUFACTURING THE SAME AND ELECTRONIC CIRCUIT UNIT

(75) Inventors: Yuu Ishii, Sakura (JP); Kunihiro Naoe, Sakura (JP)

(73) Assignee: Fujikura Ltd., Tokyo (JP)

( * ) Notice: Subject to any disclaimer, the term of this patent is extended or adjusted under 35 U.S.C. 154(b) by 400 days.

(21) Appl. No.: 12/411,035

(22) Filed: Mar. 25, 2009

(65) Prior Publication Data

US 2009/0242242 A1    Oct. 1, 2009

(30) Foreign Application Priority Data

Mar. 26, 2008   (JP) .................................. 2008-079587
Apr. 1, 2008    (JP) .................................. 2008-095019

(51) Int. Cl.
*H05K 7/10* (2006.01)
(52) U.S. Cl. ........................................ 361/767
(58) Field of Classification Search .................. 361/767, 361/779, 760; 174/260–266
See application file for complete search history.

(56) References Cited

U.S. PATENT DOCUMENTS

| 5,422,516 | A  | * | 6/1995  | Hosokawa et al. | 257/775 |
| 5,870,289 | A  | * | 2/1999  | Tokuda et al.   | 361/779 |
| 7,331,796 | B2 |   | 2/2008  | Hougham et al.  |         |
| 7,748,991 | B2 | * | 7/2010  | Nikaido et al.  | 439/71  |
| 7,785,111 | B2 | * | 8/2010  | Hilty et al.    | 439/66  |
| 2006/0272942 | A1 | * | 12/2006 | Sirringhaus | 204/406 |
| 2009/0119916 | A1 | * | 5/2009  | Hougham et al. | 29/884 |

FOREIGN PATENT DOCUMENTS

| JP | 10303345     |   | 11/1998 |
| JP | 11-214594    | A | 8/1999  |
| JP | 2001-332321  | A | 11/2001 |

(Continued)

OTHER PUBLICATIONS

"Overview for BGA (Ball Grid Array) Matrix Series Sockets" Tyco Electronics, http://catalog.tycoelectronics.com/TE/bin/TE.Menu?M=MINF&MHID=112&MRDI=27145&BML=10576,175 60,17578,17575&LG=1&I=13, 2009 Tyco Electronics. "MC-LGA-Socket" Tyco Electronics, http://catalog.tycoelectronics.com/TE/Presentations/1773377_mc-lga.pdf, 2004 Tyco Electronics.

(Continued)

*Primary Examiner* — Jean F Duverne
(74) *Attorney, Agent, or Firm* — Sughrue Mion, PLLC

(57) ABSTRACT

An electronic component mounting board, including: a substrate base made of a flat-plate-like elastic body, the substrate base having a plurality of through-holes in a manner spaced a predetermined distance apart from each other; conductive members, each of which has a main unit portion filled in the through-hole, the main unit portion having a first protrusion portion and a second protrusion portion respectively on a first end and a second end thereof, with the first protrusion portion arranged so as to protrude from a first surface of the substrate base and the second protrusion portion arranged so as to protrude from a second surface of the substrate base; a flexible substrate that is arranged on the first surface of the substrate base and that has first opening portions for penetration of the first protrusion portions; and a plurality of oval electrodes arranged on the substrate, each of which has a second opening portion for penetration of the first protrusion portion, in which the electrodes are arranged in a manner spaced apart from each other, and each of the second opening portions is formed on a first end side of each of the electrodes.

7 Claims, 26 Drawing Sheets

FOREIGN PATENT DOCUMENTS

| | | | |
|---|---|---|---|
| JP | 200386739 | A | 3/2003 |
| JP | 200315709 | A | 5/2003 |
| JP | 2003198068 | A | 7/2003 |
| JP | 2004-158430 | A | 6/2004 |
| JP | 2005-019284 | A | 1/2005 |
| JP | 4041868 | A | 11/2007 |
| JP | 2008-021637 | A | 1/2008 |
| JP | 4041868 | B2 | 2/2008 |
| KR | 10-2008-0056016 | A | 6/2008 |
| WO | 01/75969 | A1 | 10/2001 |

OTHER PUBLICATIONS

"Overview for BGA (Ball Grid Array) Matrix Series Sockets" Tyco Electronics, http://catalog.tycoelectronics.com/TE/bin/TE.Menu?M=MINF&MHID=112&MRDI=27145&BML=10576,17560,17578,17575&LG=1&I=13, 2009 Tyco Electronics.

Japanese Notice of Allowance received Sep. 27, 2011 in corresponding Japanese Application No. 2008-095019.

* cited by examiner

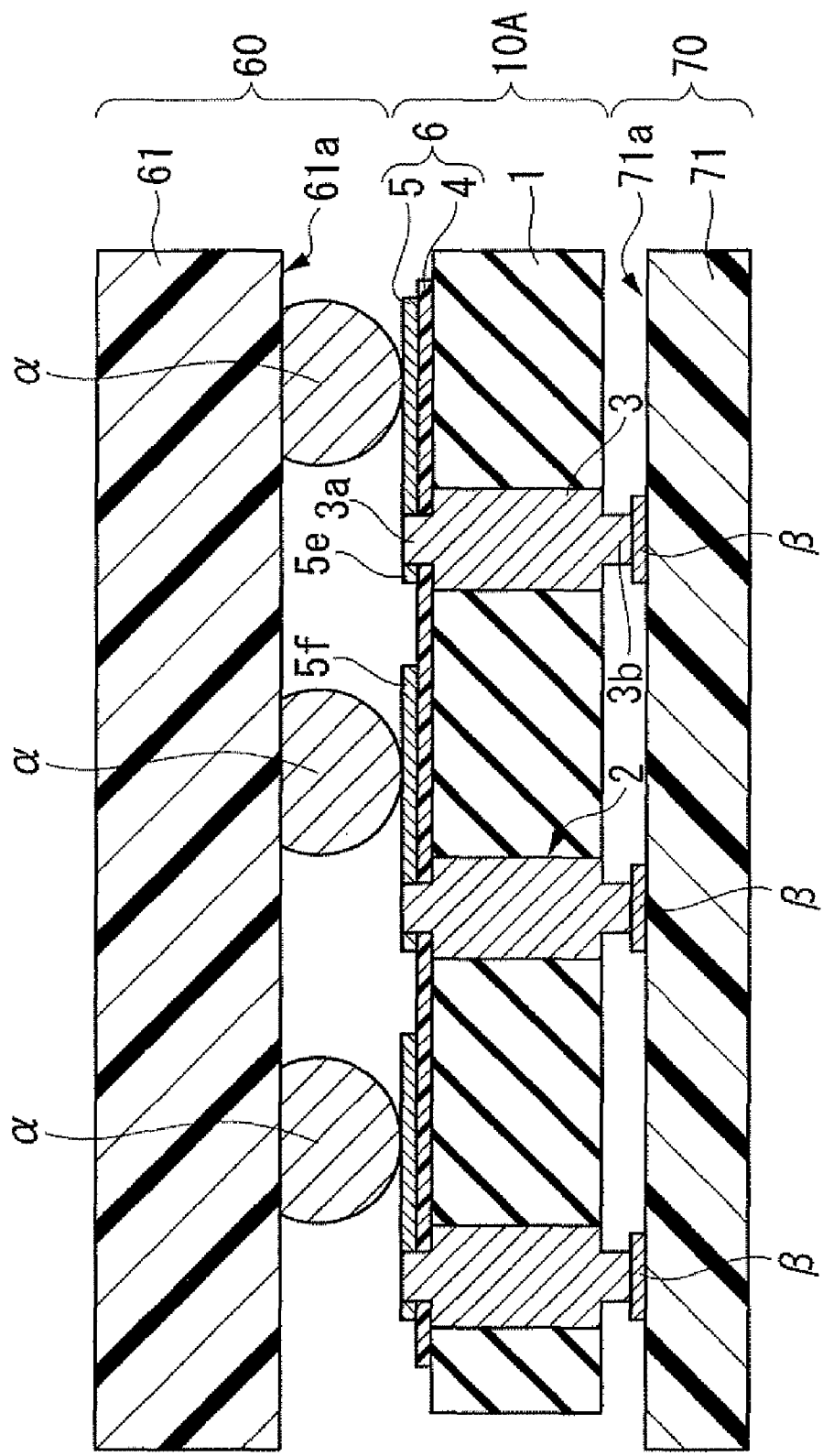

ELECTRONIC COMPONENT MOUNTING BOARD, METHOD FOR MANUFACTURING THE SAME AND ELECTRONIC CIRCUIT UNIT

Priority is claimed on Japanese Patent Application No. 2008-079587, filed on Mar. 26, 2008, and Japanese Patent Application No. 2008-095019, filed on Apr. 1, 2008, the contents of which are incorporated herein by reference.

BACKGROUND OF THE INVENTION

1. Field of the Invention

The present invention relates to an electronic component mounting board. More particularly, the present invention relates to an electronic component mounting board that is capable of securing a sufficient contact pressure irrespective of irregularities in height of electronic components and is also capable of lowering conduction resistance and inductance, relates to a method for manufacturing the same and relates to an electronic circuit unit provided with the electronic component mounting board.

2. Description of Related Art

As conventional methods of mounting an electronic component on a circuit board with electrodes with different heights and on the like, there are disclosed: a method as described for example in Japanese Unexamined Patent Application, First Publication No. H11-214594 (hereinafter, referred to as Patent Document 1) in which a mounting board using an anisotropic conductive elastomer sheet is used; a method in which a mounting board using a conductive elastomer is used as shown for example in FIG. 26; and a method in which a mounting board using blade springs as shown for example in FIG. 27.

However, in the method using an anisotropic conductive elastomer sheet as described in Patent Document 1, conductive microparticles are dispersed in the elastomer to provide conductivity. Therefore, compared with a good conductor such as a metal, it is inevitable that the elastomer will have high contact resistance and high conduction resistance. Moreover, it is difficult to make the pitch narrow. Furthermore, high costs are required because an anisotropic conductive elastomer sheet itself is expensive.

In the mounting method as shown in FIG. 26 in which one of the conductive elastomer pillars 103 is used to electrically connect a solder bump α of an electronic component 160 with a conduction portion β of a circuit board 170, contact resistance and conduction resistance are high compared with a good conductor such as a metal, as is the case where an anisotropic conductive elastomer sheet is used. To lower the contact resistance and the conduction resistance, a proportion of the conductive microparticles mixed in the elastomer may be increased. However, this will decrease the deformability of the conductive elastomer pillars 103. That is, the conductive elastomer pillars 103 become highly elastic rigid bodies, for which it is difficult to have a displacement amount sufficient for strokes of contact electrodes. When the electronic component 160 and the circuit board 170 with irregularity in height are mounted without a sufficient stroke amount being provided like this, the conductive elastomer pillars 103 are brought into mechanical contact with tall electrodes to allow for conduction, but are brought into insufficient mechanical contact with short electrodes. As a result, there is a possibility of poor conduction or increase in contact resistance.

In the method as shown in FIG. 27 in which blade springs 113 are used to electrically connect an electronic component 160 with a circuit board 170, it is required to provide a mechanical spring structure. Therefore, it is difficult to make a terminal pitch small. In addition, there is a possibility of decrease in conductivity due to oxidation of the blade spring 113.

Furthermore, to secure a sufficient stroke amount, it is required to make the blade springs long. Moreover, to make the terminal pitch small, it is required to make the blade springs thin. Therefore, in either case, inductance is increased. As a result, it is difficult to apply this method to high frequency electronic components.

SUMMARY OF THE INVENTION

The present invention has been achieved in view of the above circumstances, and has an object to provide an electronic component mounting board that is capable of securing a sufficient contact pressure, low in contact resistance and inductance, excellent in conductivity, and capable of reducing costs, even if an electronic part whose contact portions are different in height is mounted.

To solve the above problems and achieve the object, the present invention adopts the following.

(1) An electronic component mounting board of the present invention includes: a substrate base made of a flat-plate-like elastic body, the substrate base having a plurality of through-holes in a manner spaced a predetermined distance apart from each other; conductive members, each of which has a main unit portion filled in the through-hole, the main unit portion having a first protrusion portion and a second protrusion portion respectively on a first end and a second end thereof, with the first protrusion portion arranged so as to protrude from a first surface of the substrate base and the second protrusion portion arranged so as to protrude from a second surface of the substrate base; a flexible substrate that is arranged on the first surface of the substrate base and that has first opening portions for penetration of the first protrusion portions; and a plurality of oval electrodes arranged on the substrate, each of which has a second opening portion for penetration of the first protrusion portion, in which the electrodes are arranged in a manner spaced apart from each other, and each of the second opening portions is formed on a first end side of each of the electrodes.

In the electronic component mounting board of the above (1), the substrate base is made of an elastic body, and the electrodes are arranged on the first surface of the substrate base. Therefore, when the electrodes are brought into contact with the conductive portions of an electronic component or the like, it is possible to maintain a predetermined contact pressure between the electrodes and the conductive portions. Especially, even in the case where the conductive portions of the electronic component are irregular in height, the substrate base absorbs the irregularities in height. As a result, it is possible to keep a favorable contact state. Consequently, it is possible to reduce poor contact and also to lower contact resistance. Furthermore, because a conductive pin is used as a conductive member, it is possible to lower a conduction resistance. In addition, because the conductive portion can be wide and short, it is possible to lower the inductance of the electrode. Therefore, the electronic component mounting board according to the above (1) is applicable to mounting/connection of a high-frequency electronic component. Furthermore, because the spacing between the electrodes can be decreased with ease, it is possible to provide an electronic component mounting board capable of actualizing an electrode layout in which electrodes are densely arranged within a plane.

(2) It is preferable that at least the first surface of the substrate base be provided with a plurality of projection portions arranged in a manner spaced a predetermined distance apart from each other; that the through-hole be arranged between the projection portions; that the first ends of the main unit portions and top surfaces of the projection portions be on a same virtual plane; and that the substrate be arranged on the first surface side of the substrate base so as to be in contact with the top surfaces of the projection portions.

In the case of the above (2), even if conductive portions of an electronic component or the like are irregular in height, the projection portions arranged on the substrate base absorbs the irregularities when the electrodes are brought into contact with the conductive portions. As a result, it is possible to maintain a predetermined contact pressure between the electrodes and the conductive portions. Consequently, it is possible to keep a favorable contact state. In addition, it is possible to reduce poor contact and also to lower contact resistance.

(3) It is preferable that slits be arranged in the substrate, each along a shape of a second end side of each of the electrodes.

(4) It is preferable that a structure made of the electrodes and the substrate be arranged also on a second surface of the substrate base.

(5) It is preferable that a bump portion be arranged on a first surface of the electrode and also on a second end side of the electrode.

(6) It is preferable that a recessed portion be arranged in a first surface of the electrode and also on a second end side of the electrode.

(7) A manufacturing method of an electronic component mounting board of the present invention is for an electronic component mounting board that includes: a substrate base made of a flat-plate-like elastic body, the substrate base having a plurality of through-holes in a manner spaced a predetermined distance apart from each other; conductive members, each of which has a main unit portion filled in the through-hole, the main unit portion having a first protrusion portion and a second protrusion portion respectively on a first end and a second end thereof, with the first protrusion portion arranged so as to protrude from a first surface of the substrate base and the second protrusion portion arranged so as to protrude from a second surface of the substrate base; a flexible substrate that is arranged on the first surface of the substrate base and that has first opening portions for penetration of the first protrusion portions; and a plurality of oval electrodes arranged on the substrate, each of which has a second opening portion for penetration of the first protrusion portion, in which the electrodes are arranged in a manner spaced apart from each other, and each of the second opening portions is formed on a first end side of each of the electrodes, the method including the process of: providing the plurality of through-holes in the substrate base in a manner spaced a predetermined distance apart from each other; inserting the conductive members into the through-holes so that the first protrusion portions and the second protrusion portions of the conductive members protrude respectively from the first surface and the second surface of the substrate base; forming a structure by providing the electrodes on the first surface of the substrate and by providing the first opening portions in the substrate at positions corresponding to the first protrusion portions and the second opening portions in the electrodes at positions corresponding to the first protrusion portions; and providing the structure on the first surface of the substrate base so that the first protrusion portions of the conductive members are inserted into the first opening portions and the second opening portions of the structure.

(8) A manufacturing method of an electronic component mounting board that includes: a substrate base made of a flat-plate-like elastic body, the substrate base having a plurality of through-holes in a manner spaced a predetermined distance apart from each other; conductive members, each of which has a main unit portion filled in the through-hole, the main unit portion having a first protrusion portion and a second protrusion portion respectively on a first end and a second end thereof, with the first protrusion portion arranged so as to protrude from a first surface of the substrate base and the second protrusion portion arranged so as to protrude from a second surface of the substrate base; a flexible substrate that is arranged on the first surface of the substrate base and that has first opening portions for penetration of the first protrusion portions; a plurality of oval electrodes arranged on the substrate, each of which has a second opening portion for penetration of the first protrusion portion; and a plurality of projection portions arranged on at least the first surface of the substrate base, in which the electrodes are arranged with a spacing portion therebetween, and each of the second opening portions is formed on a first end side of each of the electrodes, in which the through-hole is arranged between the projection portions, in which the first ends of the main unit portions and top surfaces of the projection portions are on a same virtual plane; and in which the substrate is arranged on the first surface side of the substrate base so as to be in contact with the top surfaces of the projection portions, the method including the process of: providing the plurality of through-holes between the projection portions of the substrate base; inserting the conductive members into the through-holes so that the first protrusion portions and the second protrusion portions of the conductive members protrude respectively from the first surface and the second surface of the substrate base; forming a structure by providing the electrodes on the first surface of the substrate and by providing the first opening portions in the substrate at positions corresponding to the first protrusion portions and the second opening portions in the electrodes at positions corresponding to the first protrusion portions; and providing the structure so that the first protrusion portions of the conductive members are inserted into the first opening portions and the second opening portions of the structure and also so that the second surface of the substrate is in contact with the top surfaces of the projection portions arranged on the first surface of the substrate base.

(9) An electronic circuit unit of the present invention includes the electronic component mounting board according to the above-mentioned (1) or (2).

BRIEF DESCRIPTION OF THE DRAWINGS

FIG. 6 is a cross-sectional view schematically showing one example in which electronic components are mounted by use of the electronic component mounting board according to the embodiment.

DETAILED DESCRIPTION OF THE INVENTION

First Embodiment

Hereunder is a detailed description of the present invention with reference to the drawings. However, the present invention is not limited to this. Various modifications can be made as long as they do not depart from the spirit or scope of the present invention.

Figure 1A:
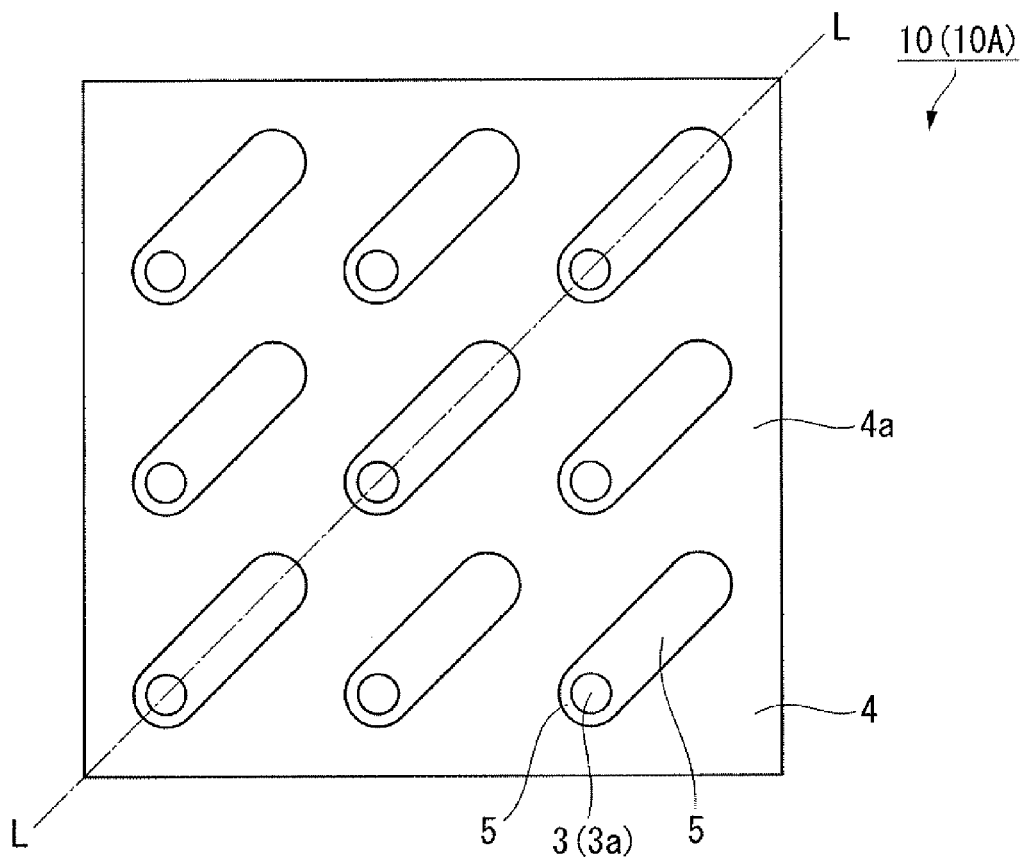
FIG. 1A is a plan view schematically showing an electronic component mounting board according to a first embodiment of the present invention.
Figure 1B:
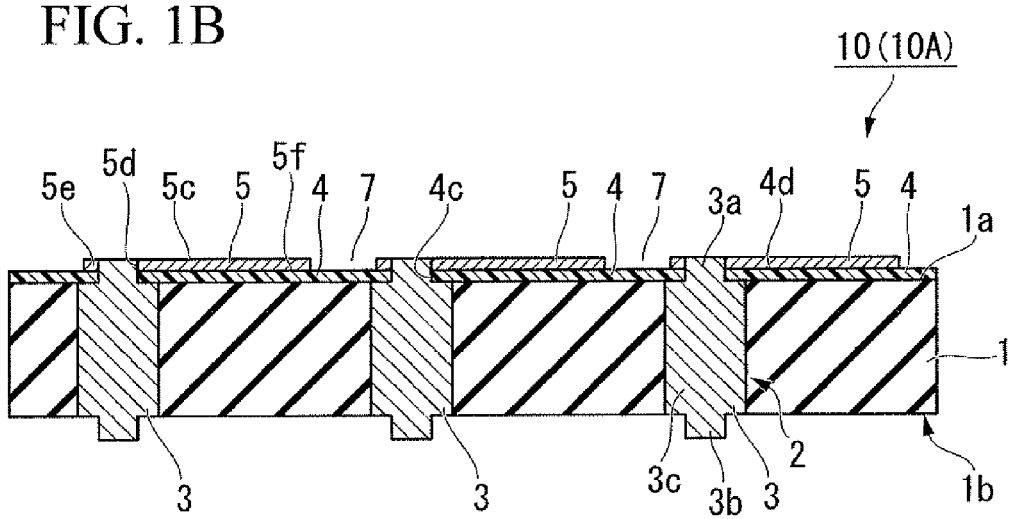
FIG. 1B is a cross-sectional view of FIG. 1A.

FIGS. 1A, 1B schematically show a first embodiment of an electronic component mounting board 10 (10A) of the present invention. FIG. 1A is a top view thereof. FIG. 1B is a cross-sectional view of FIG. 1A taken along the line L-L.

The electronic component mounting board 10A of the present invention roughly includes: a substrate base 1 made of a flat-plate-like elastic body, the substrate base 1 having a plurality of through-holes 2 in a manner spaced a predetermined distance apart from each other; conductive members 3, each of which has a main unit portion 3c filled in the through-hole 2, the main unit portion 3c having a first protrusion portion 3a and a second protrusion portion 3b respectively on a first end and a second end thereof, with the first protrusion portion 3a arranged so as to protrude from a first surface 1a of the substrate base 1 and the second protrusion portion 3b arranged so as to protrude from a second surface 1b of the substrate base 1; a flexible substrate 4 that is arranged on the first surface 1a of the substrate base 1 and that has first opening portions 4c for penetration of the first protrusion portions 3a; and a plurality of oval electrodes 5 arranged on the substrate 4, each of which has a second opening portion 5d for penetration of the first protrusion portion 3a. The electrodes 5 are arranged in a manner spaced apart from each other (with a spacing portion 7). In the vicinity of a first end 5e side of each of the electrodes 5, the second opening portion 5d is formed. Hereunder is a detailed description of these constituent parts.

The substrate base 1 is made of a flat-plate-like elastic body. In the substrate base 1, the through-holes 2 for insertion of the conductive members 3 are provided in the thickness direction thereof. The through-holes 2 are provided in the in-plane direction of the substrate base 1 in a manner spaced a predetermined distance apart from each other. Here, the predetermined distance is, for example, a 0.5-mm pitch to a 1-mm pitch. The substrate base 1 may be used with an appropriate adjustment of its thickness and hardness (elasticity) according to a stroke amount required. The thickness is, for example, 200 μm to 1000 μm.

The substrate base 1 is an elastomer. It is made of, for example, a natural rubber, a latex, a butyl rubber, a silicone rubber, a fluoride rubber, or the like. It is possible to appropriately select one from among these according to the stroke amount and property required for the substrate base 1. In the case where airtightness is required, it is desirable that a butyl rubber, which is excellent in airtightness, be used. In the case where loading and unloading are frequently repeated, it is desirable that a silicone rubber be used because it has a small permanent set (permanent displacement) and a favorable reproducibility.

As for the silicone rubber, it is possible to adjust its hardness (elasticity) by a method of vulcanization or with an amount of the filler with which a rubber material is mixed. In general, with a small amount of added filler, a substrate base 1 is obtained which is soft and likely to be deformed, and hence has a large stroke amount. On the other hand, with a large amount of added filler, a substrate base 1 is obtained which is hard and unlikely to be deformed, and hence has a small stroke amount. As this filler, for example a silicon dioxide ($SiO_2$) or a carbon black may be used.

For a fluoride rubber, a fluorochemical monomer such as vinylidene fluoride, hexafluoropropylene, tetrafluoroethylene, perfluoro methylvinylether may be used as a raw material. A polymer obtained by the polymerization of a predetermined amount of the raw material is cross-linked with a peroxide or a polyol to obtain a fluoride rubber.

In the through-hole 2, the main unit portion 3c of the conductive member 3 is arranged. The through-holes 2 are provided in the substrate base 1 according to the locations of the electrodes 5 and the locations of the conductive portions of an electronic component to be mounted. The size of the through-hole 2 may be appropriately adjusted according to the required inductance (the size of the conductive member 3). It is, for example, 50 μm to 250 μm.

The conductive member 3 is a pin-like one made of: the main unit portion 3c filled in the through-hole 2; the first protrusion portion 3a protruded from the first surface 1a of the substrate base 1; and the second protrusion portion 3b protruded from the second surface 1b of the substrate base 1. For the conductive member 3, copper, brass, aluminum, stainless steel or the like, which is excellent in conductivity, may be used. The conductive member 3 may be subjected to a surface treatment as required so as to offer a favorable electric connection with the electrode 5. Especially in the case where the conductive member 3 is soldered with the electrode 5, copper or brass may be used for the conductive member 3, and flux or the like may be applied on the connection portion with the electrode 5 as required.

By use of the conductive members 3 made of a metal in this manner, it is possible to further lower the contact resistance and the conduction resistance compared with the case where the conventional anisotropic conductive elastomer or conductive elastomer is used. Furthermore, by use of the pin-like conductive members 3, it is possible to make the conductive portions (main unit portions 3c) wider and shorter. Therefore, it is possible to further reduce the inductance compared with the case where the conventional blade springs are used.

The substrate 4 is arranged on the first surface 1a of the substrate base 1. In substrate 4, the plurality of first opening portions 4c for penetration of the first protrusion portions 3a of the conductive members 3 are provided. For the substrate 4, a flexible substrate is preferably used. For example, a film-like substrate made of a polyethylene terephthalate (PET), a polyethylene naphthalate (PEN), a polyethersulfone (PES), or the like, or a substrate made of a polyimide, a polyamide-imide, polyetherimide, or the like may be used. The substrate 4 has a thickness of, for example, 25 μm to 125 μm.

The plurality of electrodes 5 are arranged on the first surface 4d of the substrate 4. Between the electrodes 5, the spacing portion 7 is provided. The electrode 5 has an oval shape. In the first end side 5e thereof, the second opening portion 5d is provided from which the first protrusion portion 3a of the conductive member 3 is exposed. The first surface 5c of the electrode 5 and the top surface of the first protrusion portion 3a may be substantially flush with each other, or may not be substantially flush with each other. Here, the phrase "substantially flush" means that the difference in level between the first surface 5c of the electrode 5 and the top surface of the first protrusion portion 3a is from −10 μm to +10 μm. With the surfaces being made substantially flush, when an electronic component is mounted, it is possible to prevent contact of the first protrusion portion 3a with another electronic component. Furthermore, it is possible to maximize the side surface area of the first protrusion portion 3a in contact with the electrode 5, to thereby allow for improvement in conduction.

For electrode 5, anything may be used without particular limit so long as it is flexible, easy to be machined, and has conductivity. For example, copper, silver, or the like may be used. The line & space between the electrodes 5 are appropriately adjustable according to the pitch of the conductive member 3. For example, when the conductive members 3 have a pitch of 1 mm, the line & space between the electrodes 5 is approximately 0.35 mm (L/S=0.350/0.350). When the conductive members 3 have a pitch of 0.75 mm, the line & space between the electrodes 5 is approximately 0.265 mm (L/S=0.265/0.265). When the conductive members 3 have a pitch of 0.5 mm, the line & space between the electrodes 5 is approximately 0.175 mm (L/S=0.175/0.175).

Figure 2A:
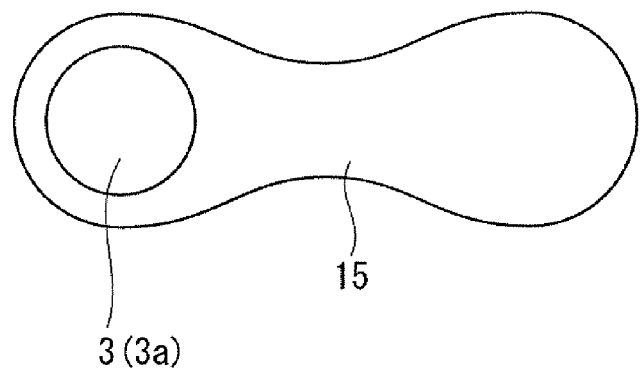
FIG. 2A is a plan view schematically showing a modification of the electrode.
Figure 2B:
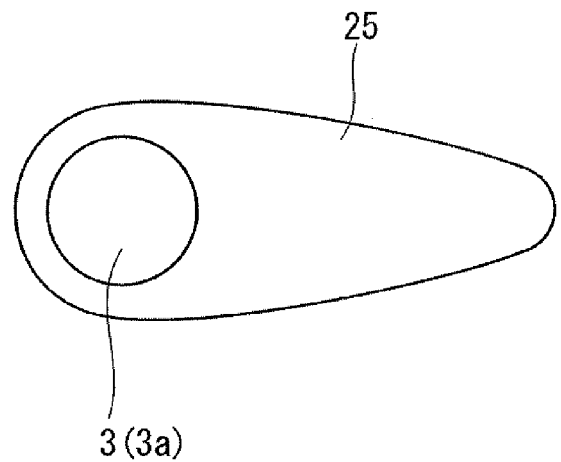
FIG. 2B is a plan view schematically showing a modification of the electrode.

The shape of the electrode 5 is not limited to the oval shape as shown in FIG. 1, so long as it offers a sufficient stroke amount when an electronic component is mounted. As ones with other shapes, for example a figure-8-shaped (pear-shaped) electrode 15 as shown in FIG. 2A or a tapered electrode 25 as shown in FIG. 2B may be used.

FIG. 3A to FIG. 5B schematically show a manufacturing method of the electronic component mounting board 10A of the present invention.

Figure 3A:
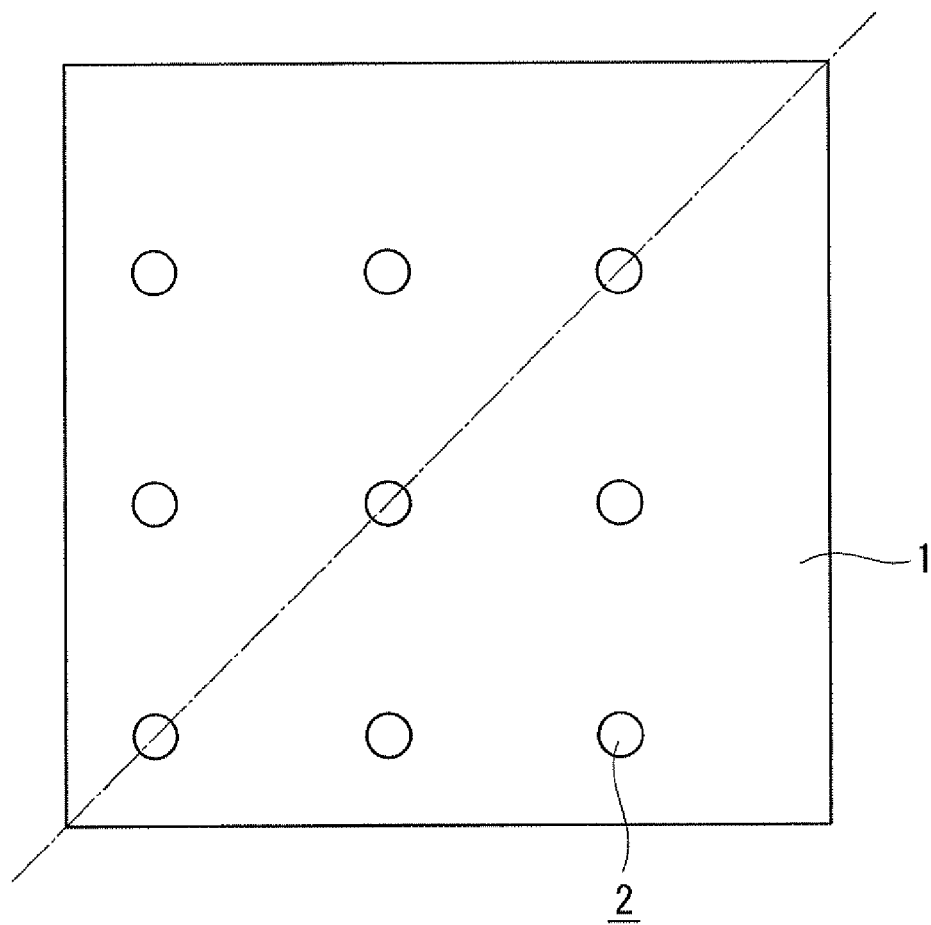
FIG. 3A is a plan view of a first step schematically showing a manufacturing method of the electronic component mounting board according to the embodiment.
Figure 3B:
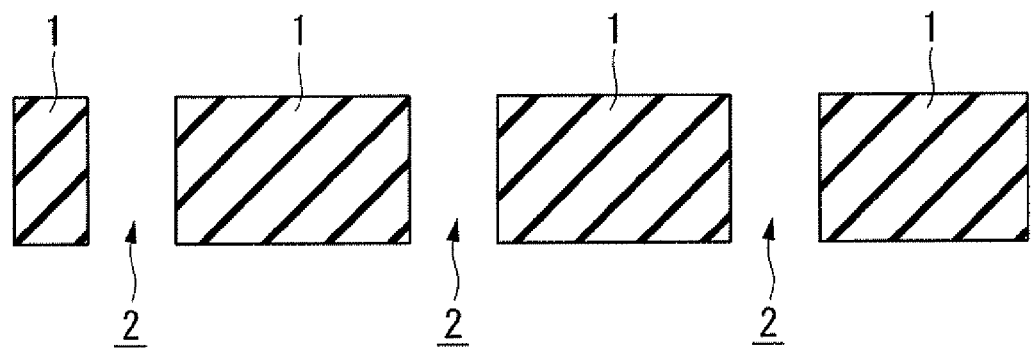
FIG. 3B is a cross-sectional view of FIG. 3A.

First, as shown in FIGS. 3A, 3B, a plurality of through-holes 2 are formed in the substrate base 1 with a desired space therebetween. FIG. 3A is a top view thereof. FIG. 3B is a cross-sectional view of 3A taken along the line L-L. It is possible to simply fabricate the substrate base 1 with the through-holes 2 by using an injection molding technique with a mold. Alternatively, a sheet-like substrate base 1 may be subjected to boring machining or machining with laser to form the through-holes 2. The through-holes 2 may be provided with a pitch of, for example, 0.5 mm to 1 mm.

Figure 4A:
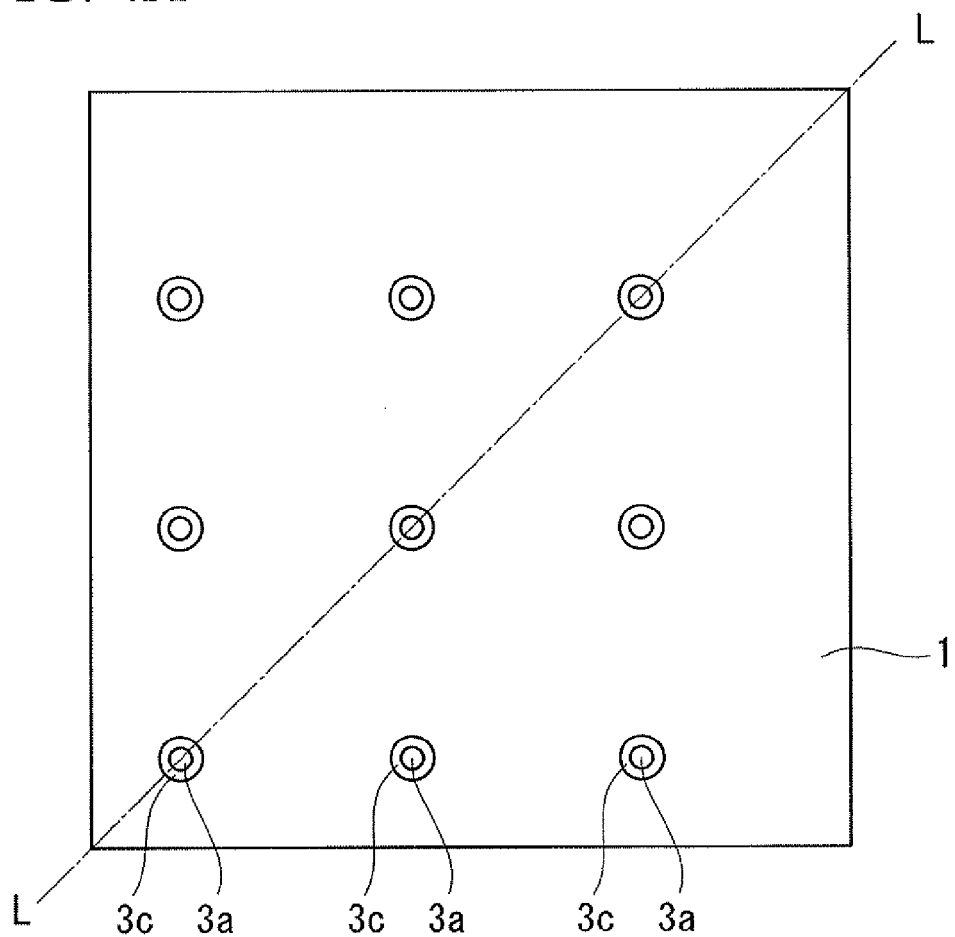
FIG. 4A is a plan view of a second step schematically showing the manufacturing method of the electronic component mounting board according to the embodiment.
Figure 4B:
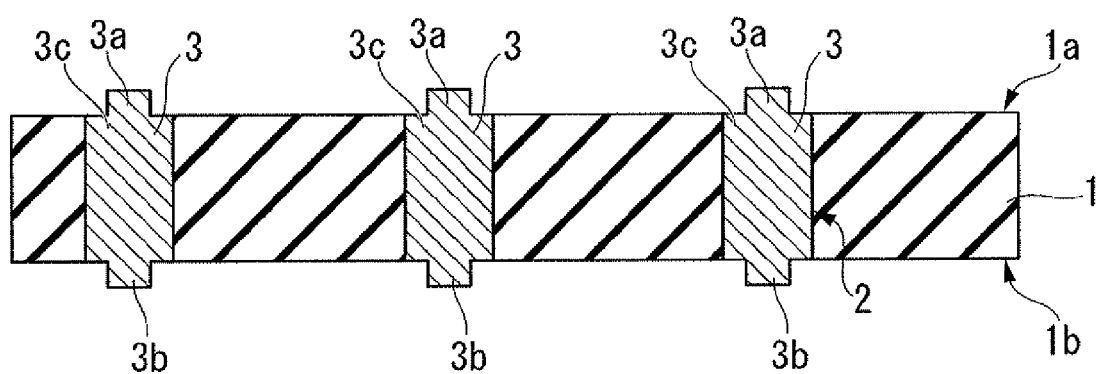
FIG. 4B is a cross-sectional view of FIG. 4A.

Next, as shown in FIGS. 4A, 4B, main unit portions 3c of conductive members 3 are inserted into the through-holes 2 fabricated in FIGS. 3A, 3B so that first protrusion portions 3a and second protrusion portions 3b of the conductive members 3 protrude respectively from first surface 1a and second surface 1b of the substrate base 1. FIG. 4A is a top view thereof. FIG. 4B is a cross-sectional view of 4A taken along the line L-L. As methods of inserting the conductive members 3 into the through-holes 2, a press fitting, an insert molding, and the like are used in general. However, the method is not particularly limited so long as the conductive members 3 can be inserted into the through-holes 2 of the substrate base 1 without damage.

Figure 5A:
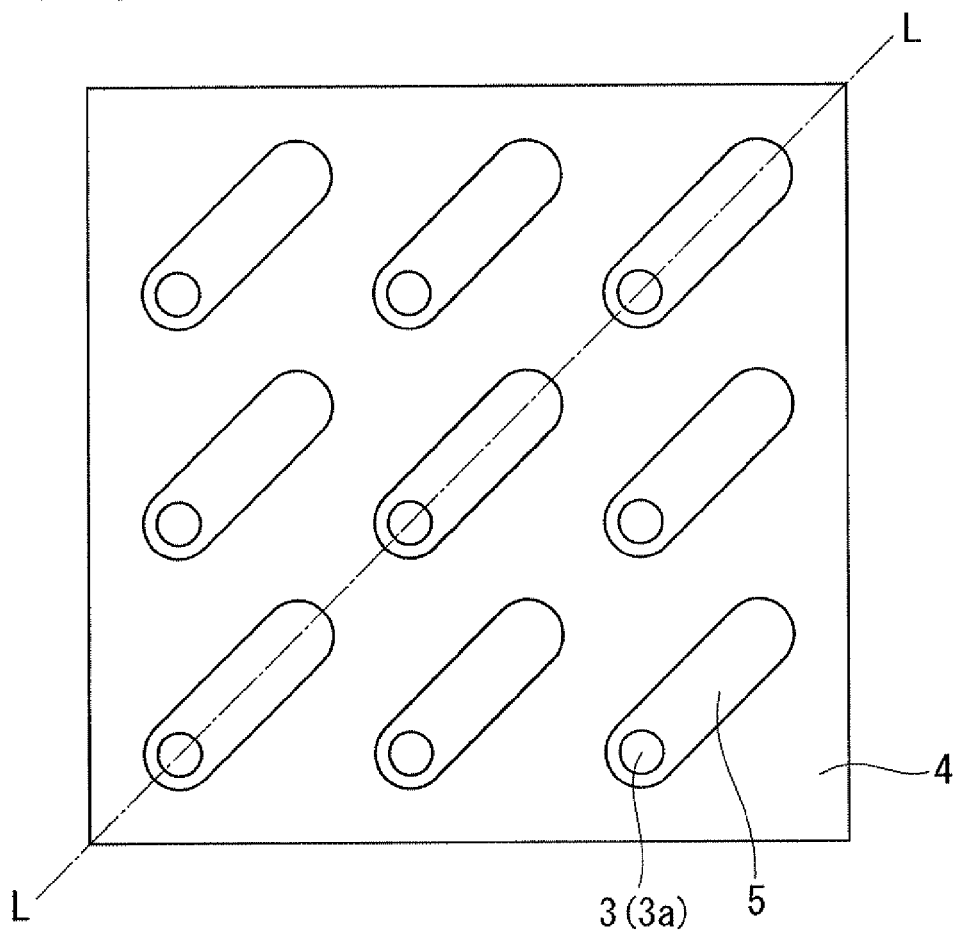
FIG. 5A is a plan view of a third step schematically showing the manufacturing method of the electronic component mounting board according to the embodiment.
Figure 5B:
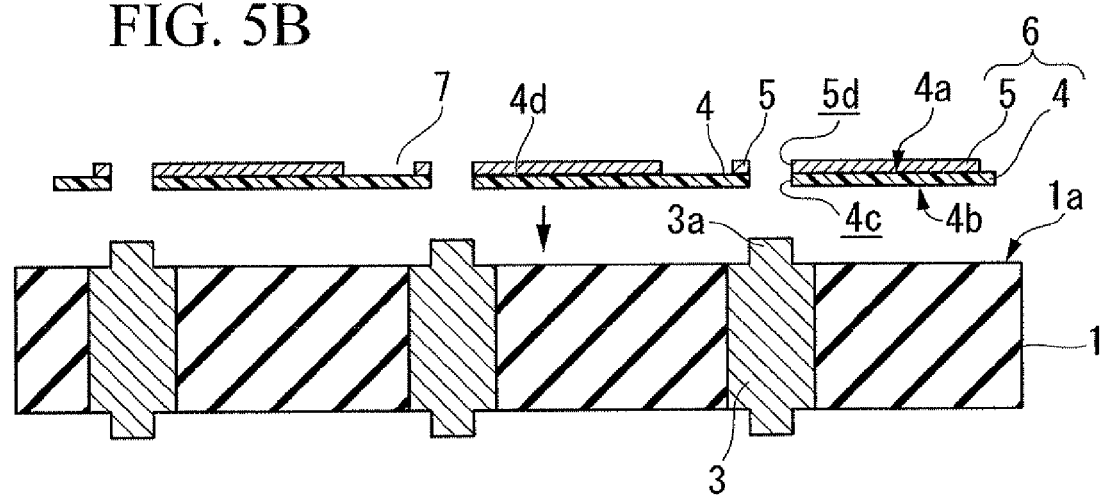
FIG. 5B is a cross-sectional view of FIG. 5A.

Next, as shown in FIGS. 5A, 5B, a plurality of electrodes 5 are formed in a first surface 4d of a substrate 4. In addition, first opening portions 4c for penetration of first protrusion portions 3a of the conductive members 3 are fabricated in the substrate 4, and second opening portions 5d also for penetration of the first protrusion portions 3a are fabricated in the electrodes 5, to thereby form a structure 6. Alternatively, the first opening portions 4c may be first formed in the substrate 4, and then the electrodes 5 may be formed so as to have the second opening portions 5d. FIG. 5A is a top view thereof. FIG. 5B is a cross-sectional view of 5A taken along the line L-L.

The structure 6 may be formed by a conventional known method. In the case where the substrate 4 is made of a film of for example a PET, a PEN, a PES or the like, a conductive paste or the like including Ag powder is printed, applied, or drawn on the film, to thereby form electrodes 5.

In the case where the substrate 4 is made of a polyimide, a polyamide-imide, a polyether, or the like, electrodes 5 made of a Cu-based metal are formed on the first surface 4d of the substrate 4.

Methods of forming the metal electrode 5 include a subtractive method where a copper-foil-clad flexible substrate, in which a flat-rolled copper foil or an electrolytic copper foil is attached over the substrate 4, is subjected to the lithography technique (a circuit pattern formation through a series of processes including resist application, exposure, development, etching, and removal of the resist). Alternatively, a semi-additive method may be used. In the method, after a copper layer of approximately 0.1 to 1.0 µm is formed on the aforementioned film by electroless plating or the like, a resist is applied thereon. Then, the lithography technique is used to form a plating resist pattern. After that, the copper foil only on the electrode 5 portion is made thicker by electrolytic plating, and then the unnecessary seed layer is removed. Alternatively, the additive method where a copper electrode pattern is grown after the pattern formation of the electrode 5 by the resist, or other methods may be used.

After that, the first protrusion portions 3a of the conductive members 3 are inserted into the first opening portions 4c and the second opening portions 5d, to thereby arrange the structure 6 on the first surface 1a of the substrate base 1.

As described above, the electronic component mounting board 10A of the present invention is obtained.

FIG. 6 is a cross-sectional view schematically showing one example of an electronic component obtained by using the electronic component mounting board 10A of the present embodiment to mount an electronic component 60 (for example, a semiconductor electronic circuit 60) onto a circuit board 70. Each solder bump α arranged on a first surface 61a of a first base material 61 of the electronic component 60 is in contact with each electrode 5, and each second protrusion portion 3b of each conductive member 3 is in contact with each conductive portion β arranged on a first surface 71a of a second base material 71 of the circuit board 70. Thereby, each solder bump α and each conductive portion β are electrically connected.

For the electronic component 60 and the circuit board 70, known ones may be used without particular limitation. For the solder bumps α arranged on the semiconductor electronic circuit 60 and the conductive portions β arranged on the circuit board 70, conventionally known ones may be used, and their sizes and the like are not particularly limited.

With the adjustment of a location at which an electrode 5 is in contact with a solder bumps α, a stroke amount is appropriately adjustable. That is, if a solder bump α is larger in size than the other solder bumps, or is arranged at a position higher than those of the other solder bumps, the electrode 5 is brought into contact with the solder bump α in the vicinity of a second end 5f side of the electrode 5, to thereby make the stroke amount larger. If a solder bump α is smaller than the other solder bumps, or is arranged at a position lower than those of the other solder bumps, the electrode 5 is brought into contact with the solder bump α in the vicinity of the first end 5e side of the electrode 5, to thereby make the stroke amount smaller.

In this manner, a contact location between the solder bump α and the electrode 5 is changed according to the electronic component to be mounted, to thereby obtain a proper stroke amount. This can secure a sufficient contact pressure between the solder bumps α and the electrodes 5. As a result, it is possible to suppress poor conductivity and an increase in contact resistance.

The solder bumps α and the like are brought into contact with the electrodes 5 and apply a pressure. Thereby, oxide layers formed on the surfaces of the solder bumps α and the electrodes 5 are broken by the wiping effect. As a result, it is possible to improve conductivity.

Second Embodiment

Figure 7A:
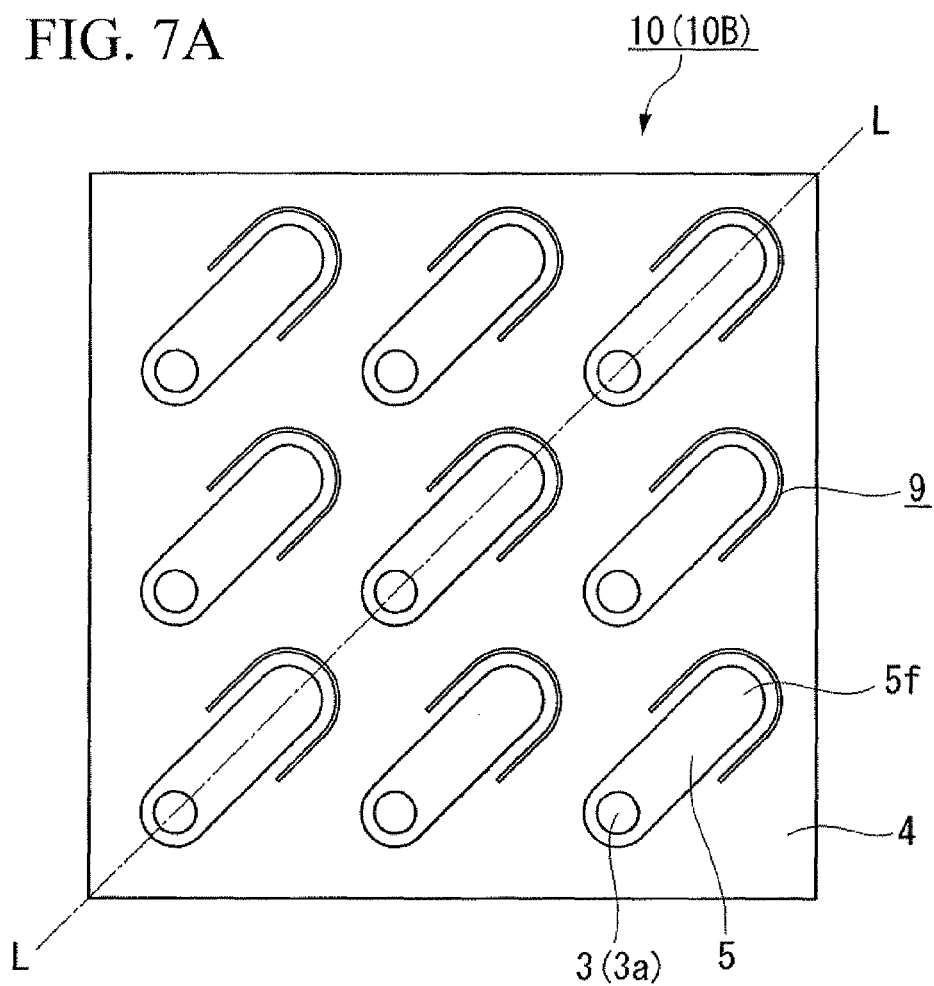
FIG. 7A is a plan view schematically showing an electronic component mounting board according to a second embodiment of the present invention.
Figure 7B:
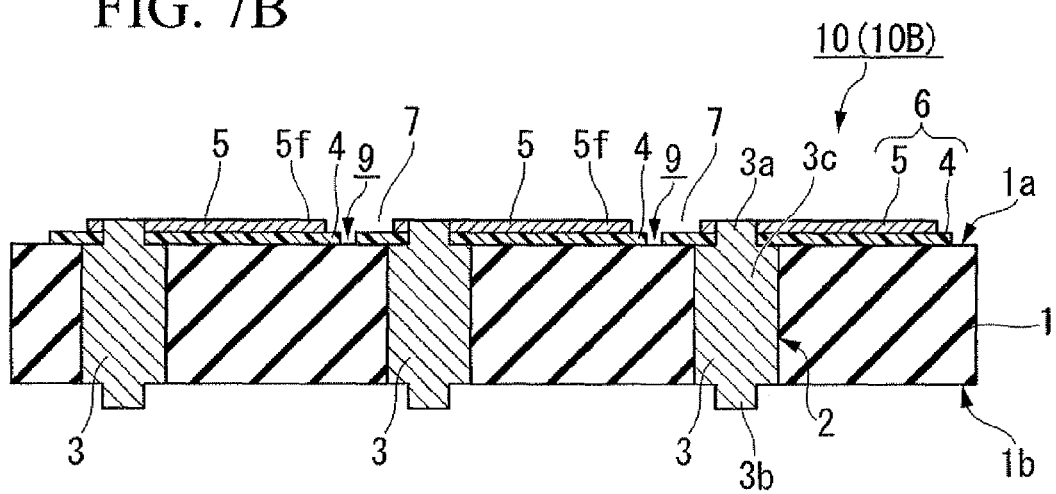
FIG. 7B is a cross-sectional view of FIG. 7A.

FIGS. 7A, 7B schematically show an electronic component mounting board 10 (10B) according to a second embodiment of the present invention. Like constituent parts to those of the first embodiment may be designated with like reference numerals and may not be repetitiously explained. FIG. 7A is a top view thereof. FIG. 7B is a cross-sectional view of FIG. 7A taken along the line L-L. The difference between the present embodiment and the first embodiment lies in that slits 9 are arranged on the substrate 4, each along the shape of the second end 5f side of the electrode 5.

The slit 9 may be arranged so as to surround at least an outer circumference on a second end 5f side of the electrode 5. With the slits 9, the stroke amount of the electrode 5 is increased, to thereby make it possible to further absorb irregularities in height of the solder bumps α when the electronic component 60 is mounted, similarly to the case of the first embodiment. Therefore, it is possible to adjust a contact pressure between the electrodes 5 and the solder bumps α of the electronic component 60 in a wider area. As a result, it is possible to uniform the heights of the electronic component, and hence suppress poor contact and the like more effectively.

To fabricate such slits 9 in the substrate 4, the substrate 4 is machined with a boring machine or with laser. Thereby, it is possible to simply provide the slits 9, with favorable accuracy.

Third Modification

Figure 8A:
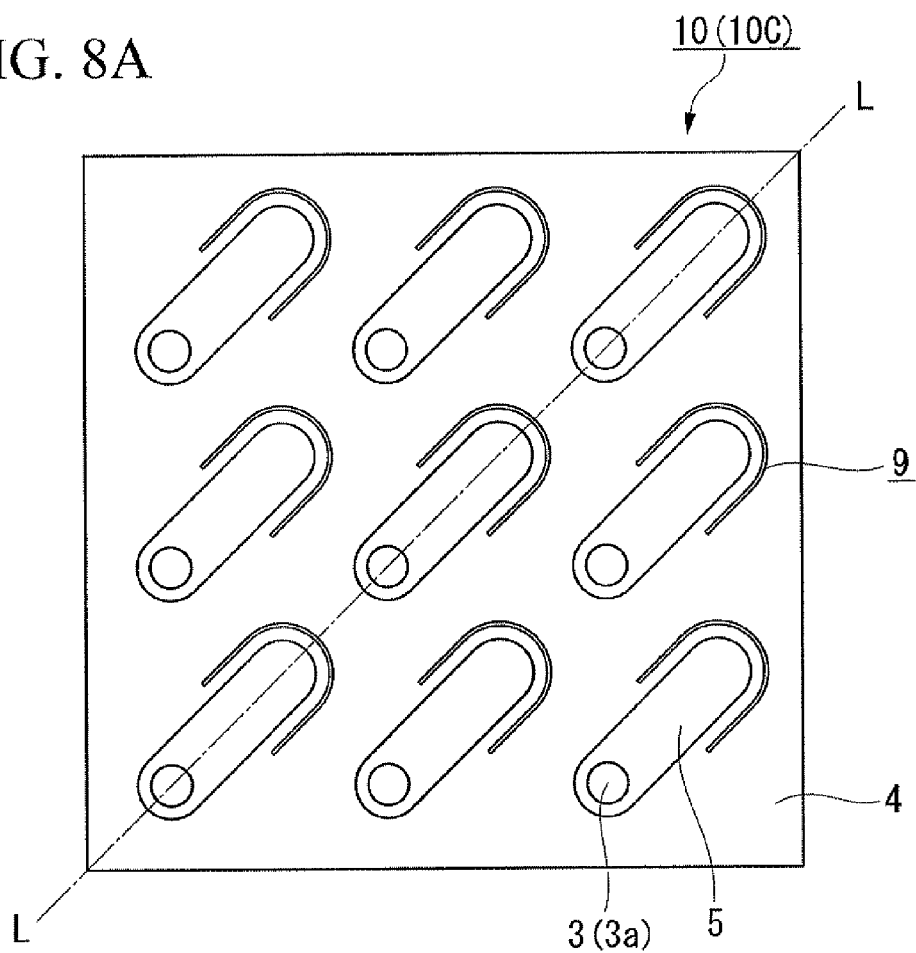
FIG. 8A is a plan view schematically showing an electronic component mounting board according to a third embodiment of the present invention.
Figure 8B:
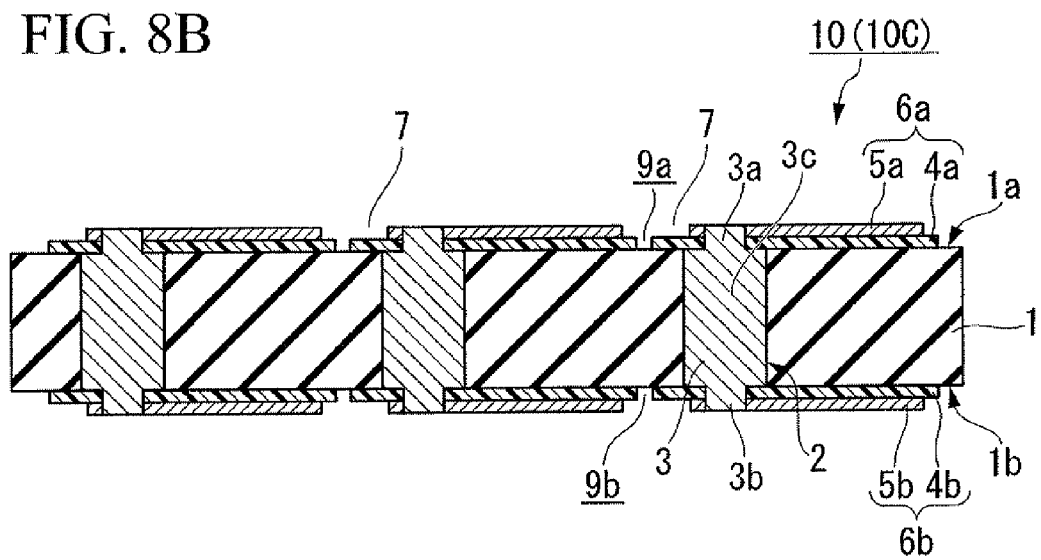
FIG. 8B is a cross-sectional view of FIG. 8A.

FIGS. 8A, 8B schematically show an electronic component mounting board 10 (10C) according to a third embodiment of the present invention. Like constituent parts to those of the second embodiment may be designated with like reference numerals and may not be repetitiously explained. FIG. 8A is a top view thereof. FIG. 8B is a cross-sectional view of FIG. 8A taken along the line L-L. The difference between the present embodiment and the second embodiment lies in that structures 6 (6a, 6b) are arranged on both sides 1a, 1b of the substrate base 1.

With the substrates 4 (4a, 4b) on which electrodes 5 (5a, 5b) are arranged, that is, structures 6 (6a, 6b) being provided on both sides 1a, 1b of the substrate base 1 as in the present embodiment, it is possible to further absorb irregularities in height on both sides of the substrate base 1 when an electronic component or the like is mounted. Therefore, it is possible to mount the electronic component 60 and circuit board 70 with irregularities in height onto both sides of the substrate base 1, thus allowing for assembly of an electronic circuit unit with a high degree of design.

FIGS. 8A, 8B show the electronic component mounting board where the slits 9 are provided in the substrates 4 (4a, 4b) arranged on both sides of the substrate base 1. However, in the case where a required stroke amount is small, the slits 9 may not be provided in the substrates 4 similarly to the case of the first embodiment, or the slits 9 may be provided in only either one of the substrates 4a, 4b.

Figure 9:
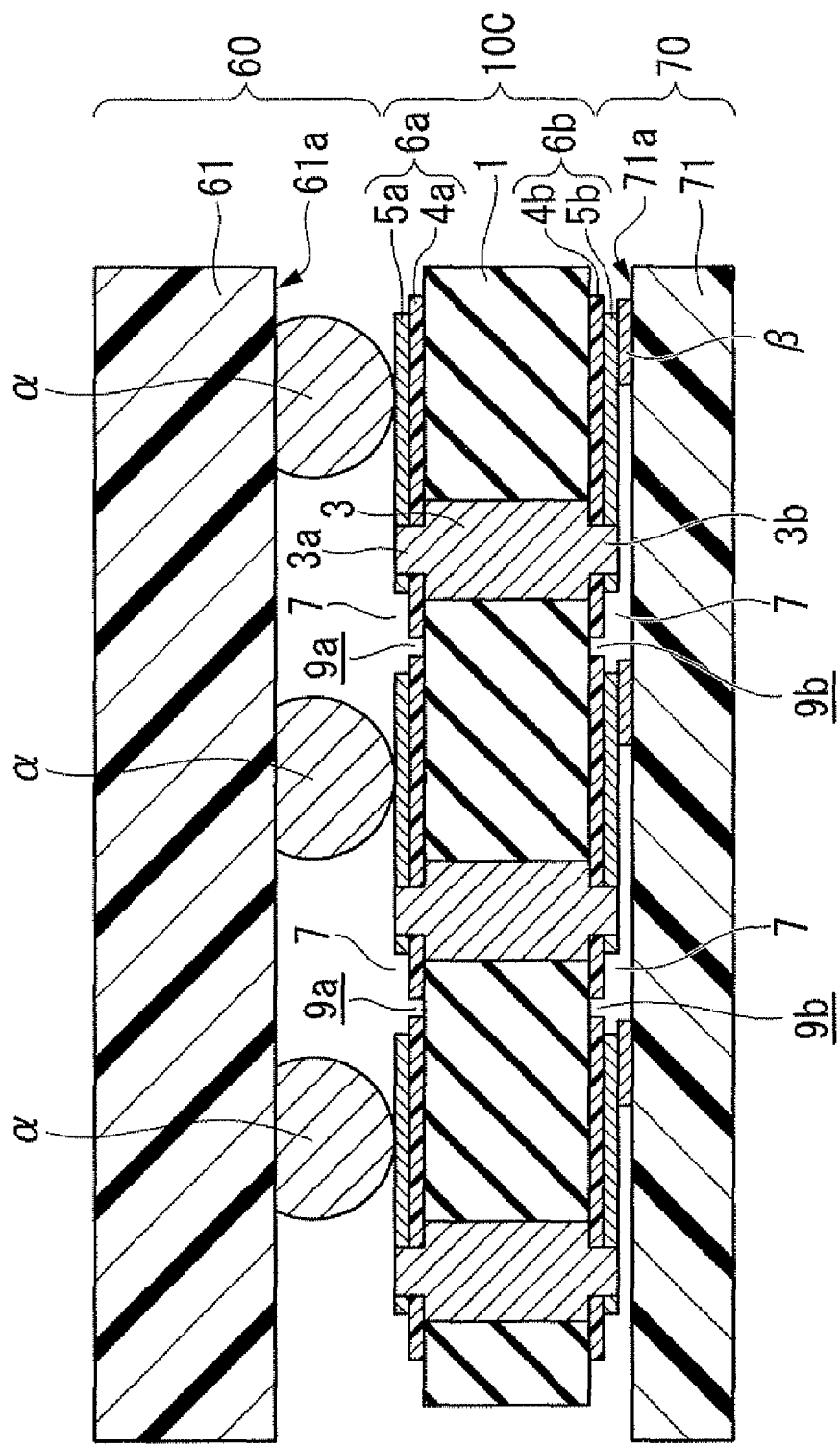
FIG. 9 is a cross-sectional view schematically showing one example in which electronic components are mounted by use of the electronic component mounting board according to the embodiment.

FIG. 9 is a cross-sectional view schematically showing one example where the electronic component mounting board 10C of the present embodiment is used to mount an electronic component 60 (for example, a semiconductor electronic circuit 60) onto a circuit board 70. Each solder bump α arranged on the semiconductor electronic circuit 60 is in contact with each electrode 5a arranged on a first surface 1a of a substrate base 1, and each electrode 5b arranged on a second surface 1b of the substrate base 1 is in contact with each conductive portion β of the circuit board 70. Thereby, each solder bump α and each conductive portion β are electrically connected. In the case where the electronic component mounting board 10C of the present embodiment is used, the advantage similar to that of the aforementioned first embodiment is obtained. In addition, because the structures 6 (6a, 6b) are arranged on both sides of the substrate base 1, it is possible to mount the circuit board 70 with irregularities in height onto both sides of the substrate base 1, to thereby make it possible to obtain an electronic circuit unit with a high degree of design. Furthermore, the conductive portions β are brought into contact with the electrodes 5b and apply a pressure. Thereby, oxide layers formed on the surfaces of the conductive portions β and the electrodes 5b are broken by the wiping effect. As a result, it is possible to improve conductivity.

Fourth Embodiment

Figure 10A:
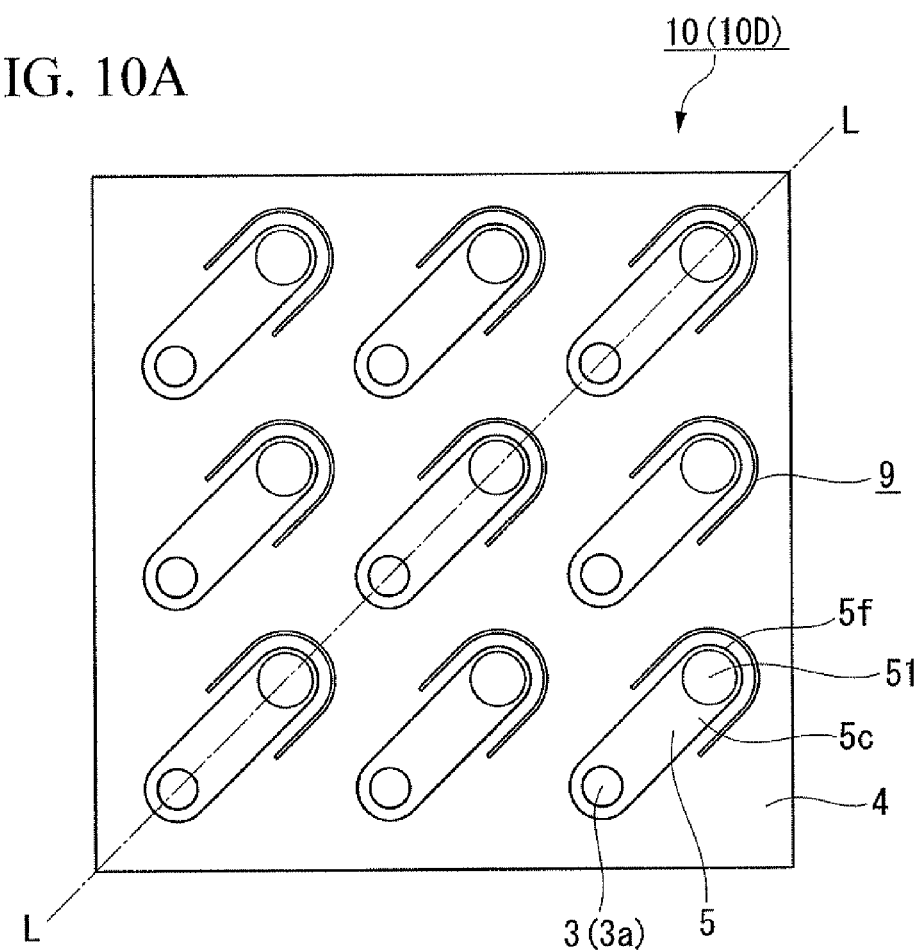
FIG. 10A is a plan view schematically showing an electronic component mounting board according to a fourth embodiment of the present invention.
Figure 10B:
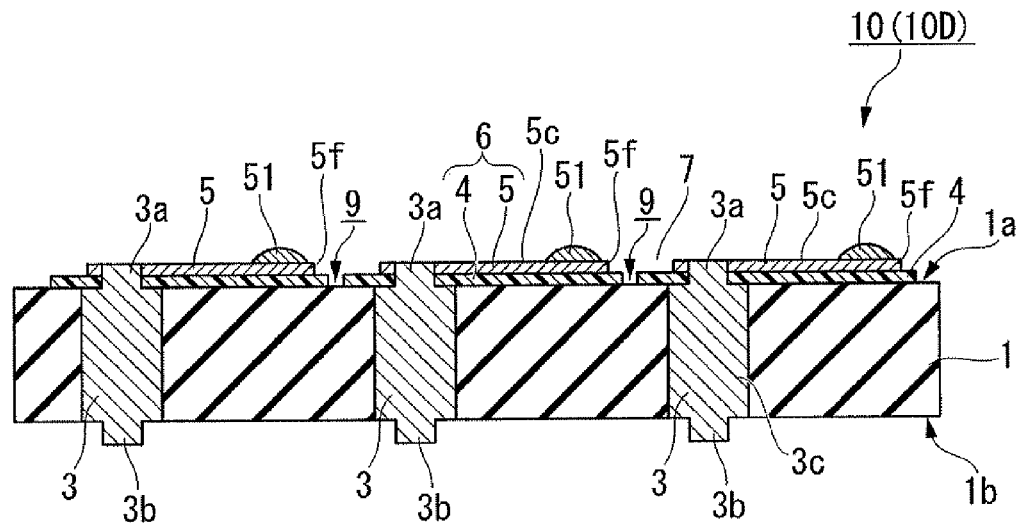
FIG. 10B is a cross-sectional view of FIG. 10A.

FIGS. 10A, 10B schematically show an electronic component mounting board 10 (10D) according to a fourth embodiment of the present invention. FIG. 10A is a top view thereof. FIG. 10B is a cross-sectional view of FIG. 10A taken along the line L-L. The difference between the present embodiment and the second embodiment lies in that each bump portion 51 is arranged on a first surface 5c of each electrode 5 and also on a second end 5f side of the electrode 5, that is, in that bump portions 51 are arranged in the vicinity of contact points at which the electrodes 5 are brought into contact with the conductive portions (solder bumps α) of the electronic component 60.

The bump portions 51 are arranged at contact points at which the electrodes 5 are brought into contact with the conductive portions (solder bumps α) of the electronic component 60. The shape of the bump portion 51 is not particularly limited. For example, as shown in FIGS. 10A, 10B, the bump portion may have a curved surface, or have a surface with a plurality of projections and depressions.

With the bump portions 51 being provided in this manner, it is possible to make a contact pressure with the electronic component 60 large. Therefore, it is possible to suppress poor contact more efficiently.

FIGS. 10A, 10B show the electronic component mounting board where the slits 9 are provided in the substrate 4. However, in the case where a required stroke amount is small, the slits 9 may not be provided in the substrate 4 similarly to the case of the first embodiment.

Figure 11:
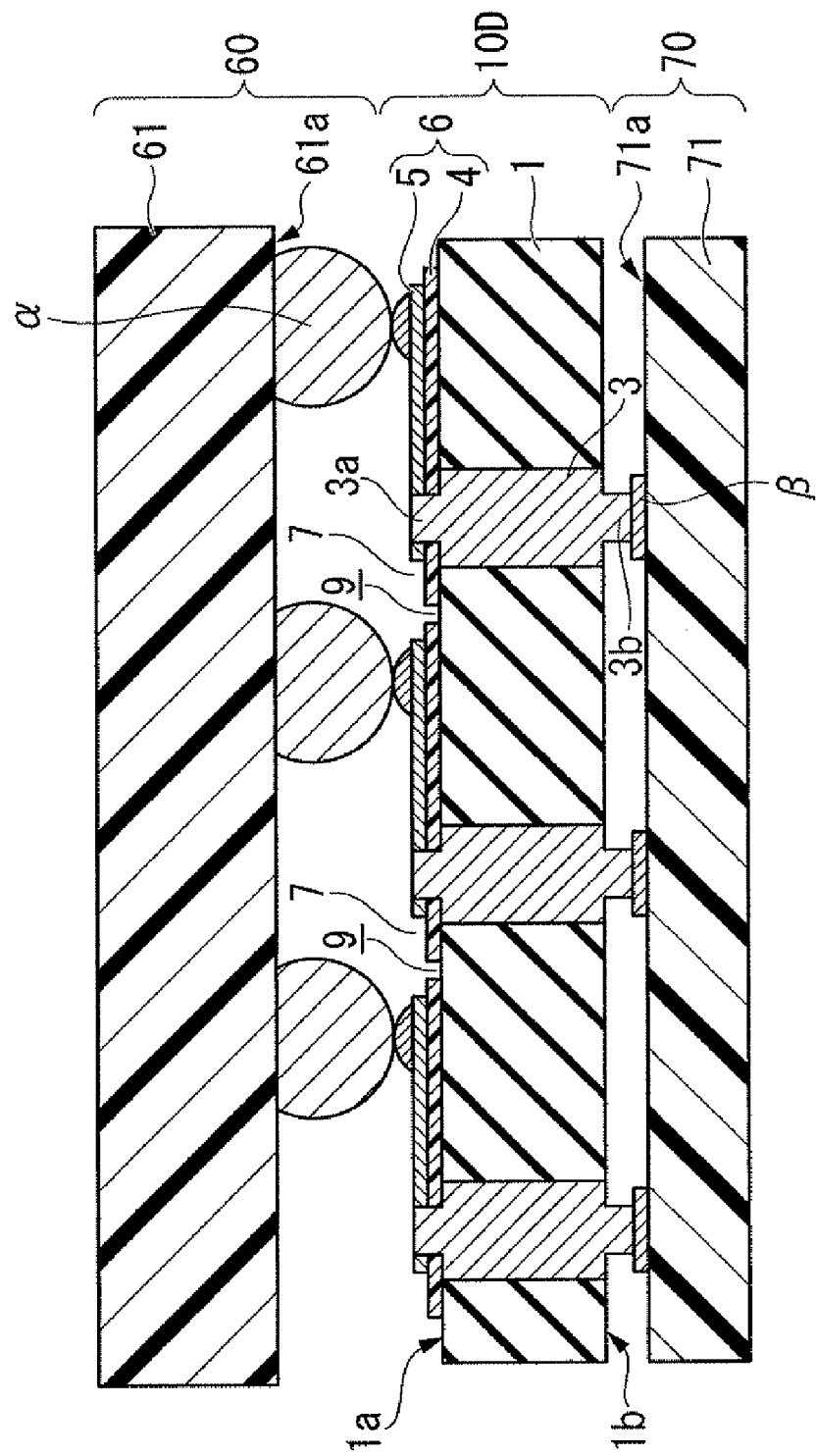
FIG. 11 is a cross-sectional view schematically showing one example in which electronic components are mounted by use of the electronic component mounting board according to the embodiment.

FIG. 11 is a cross-sectional view schematically showing one example where the electronic component mounting board 10D of the present embodiment is used to mount an electronic component 60 (for example, a semiconductor electronic circuit 60) onto a circuit board 70. Each solder bump α arranged on a first surface of the semiconductor electronic circuit 60 is in contact with a bump portion 51 arranged on each electrode 5, and each second protrusion portion 3b of each conductive member 3 is in contact with each conductive portion β arranged on the circuit board 70. Thereby, each solder bump α and each conductive portion β are electrically connected. With such contacts via the bump portions 51, it is possible to make a contact pressure large. As a result, it is possible to suppress poor contact more effectively. Furthermore, because the wiping effect on contact surfaces between the bump portions 51 and the solder bumps α becomes strong, making the oxide layers formed on the surfaces of the bump portions 51 and the solder bumps α likely to be broken. Therefore, it is possible to improve conductivity.

Fifth Embodiment

Figure 12A:
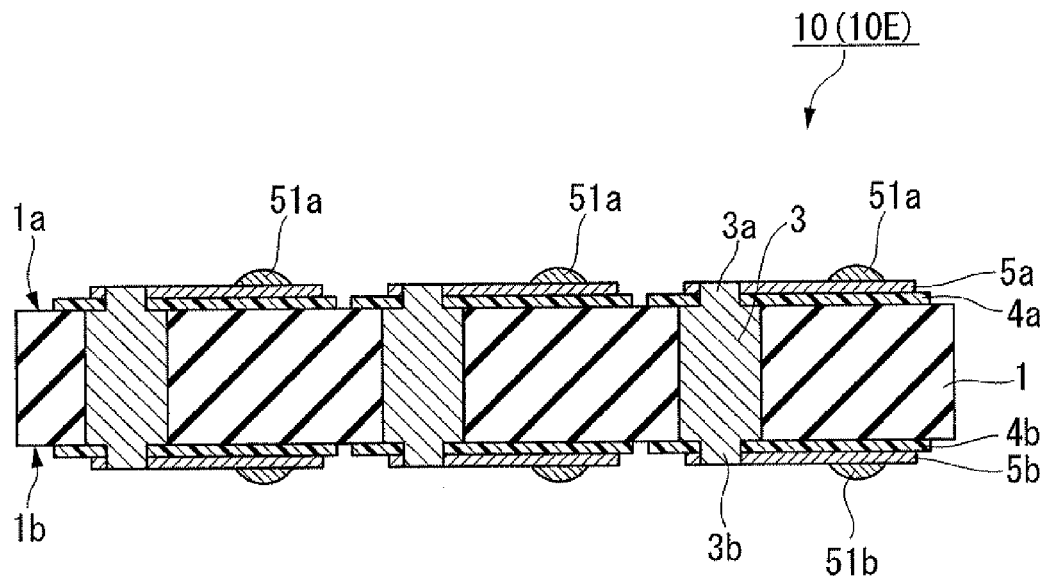
FIG. 12A is a cross-sectional view schematically showing an electronic component mounting board according to a fifth embodiment of the present invention.
Figure 12B:
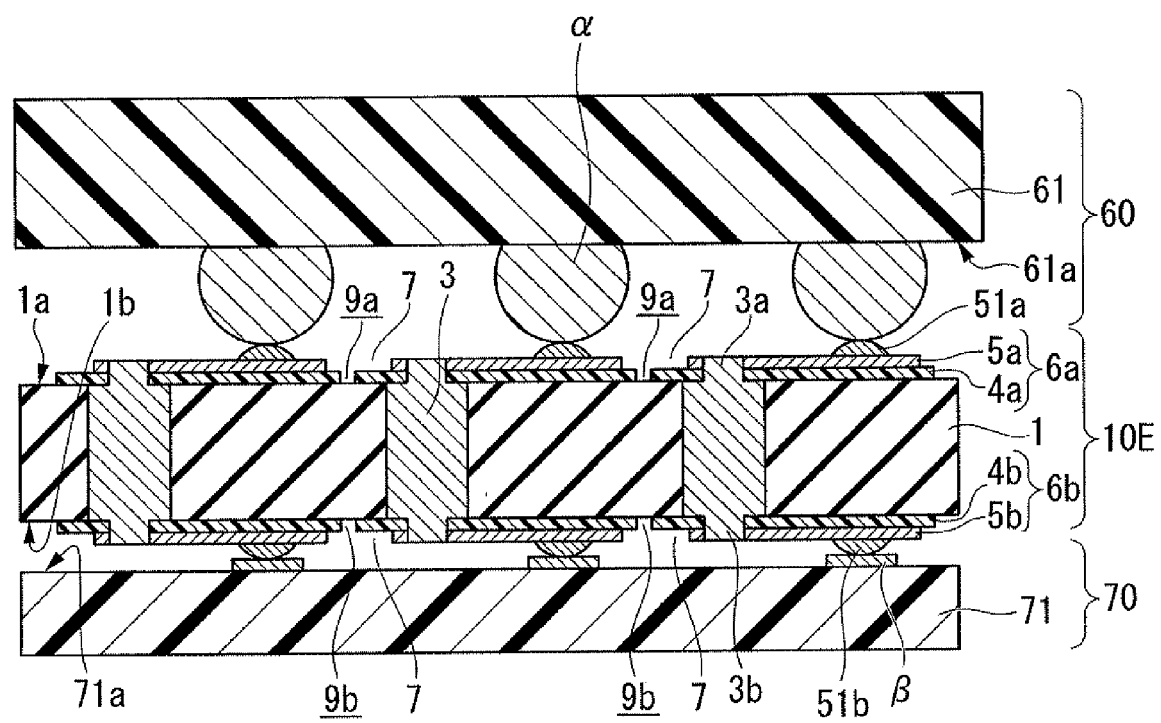
FIG. 12B is a cross-sectional view schematically showing one example in which electronic components are mounted by use of the electronic component mounting board according to the embodiment.

FIGS. 12A, 12B schematically show an electronic component mounting board 10 (10E) according to a fifth embodiment of the present invention. FIG. 12A schematically shows a cross-sectional view of the electronic component mounting board, similarly to the case of the aforementioned first embodiment to fourth embodiment. As for the plan view (top view), it is similar to that of the fourth embodiment, and hence is omitted.

The difference between the present embodiment and the third embodiment lies in that the bump portions 51 (51a, 51b) are respectively arranged, on the electrodes 5 (5a, 5b) of the structures 6 (6a, 6b) arranged on both sides of the substrate base 1, in the vicinity of the contact points with the electronic components. As for the bump portion 51, it is similar to that of the fourth embodiment.

According to the present embodiment, with the bump portions 51 being provided, it is possible to make a contact pressure with the electronic component 60 and with the circuit board 70 large. As a result, it is possible to suppress poor contact more effectively.

FIGS. 12A, 12B show the electronic component mounting board where the slits 9 are provided in the substrates 4 (4a, 4b) arranged on both sides 1a, 1b of the substrate base 1. However, in the case where a required stroke amount is small, the slits 9 may not be provided in the substrate 4 (4a, 4b) similarly to the case of the first embodiment, or the slits 9 may be provided in only either one of the substrates 4a, 4b.

FIG. 12B is a cross-sectional view schematically showing one example where the electronic component mounting board 10E of the present embodiment is used to mount an electronic component 60 (for example, a semiconductor electronic circuit 60) onto a circuit board 70. Each solder bump α arranged on a first surface of the semiconductor electronic circuit 60 is in contact with a bump portion 51a arranged on each electrode 5a, and each conductive portion β arranged on the circuit board 70 is in contact with a bump portion 51b arranged on each electrode 5b of a substrate base 1. Thereby, each solder bump α and each conductive portion β are electrically connected. With the bump portions 51 (51a, 51b) being provided respectively on the electrodes 5 (5a, 5b) arranged on both sides of the substrate base 1 in this manner, it is possible to make a contact pressure with the electronic component 60 and with the circuit board 70 large. As a result, it is possible to suppress poor contact more effectively. Furthermore, the wiping effect on contact surfaces between the bump portions 51a and the solder bumps α, and between the bump portions 51b and the conductive portions β becomes strong. Therefore, the oxide layers become likely to be broken, making it possible to improve conductivity.

Sixth Embodiment

Figure 13A:
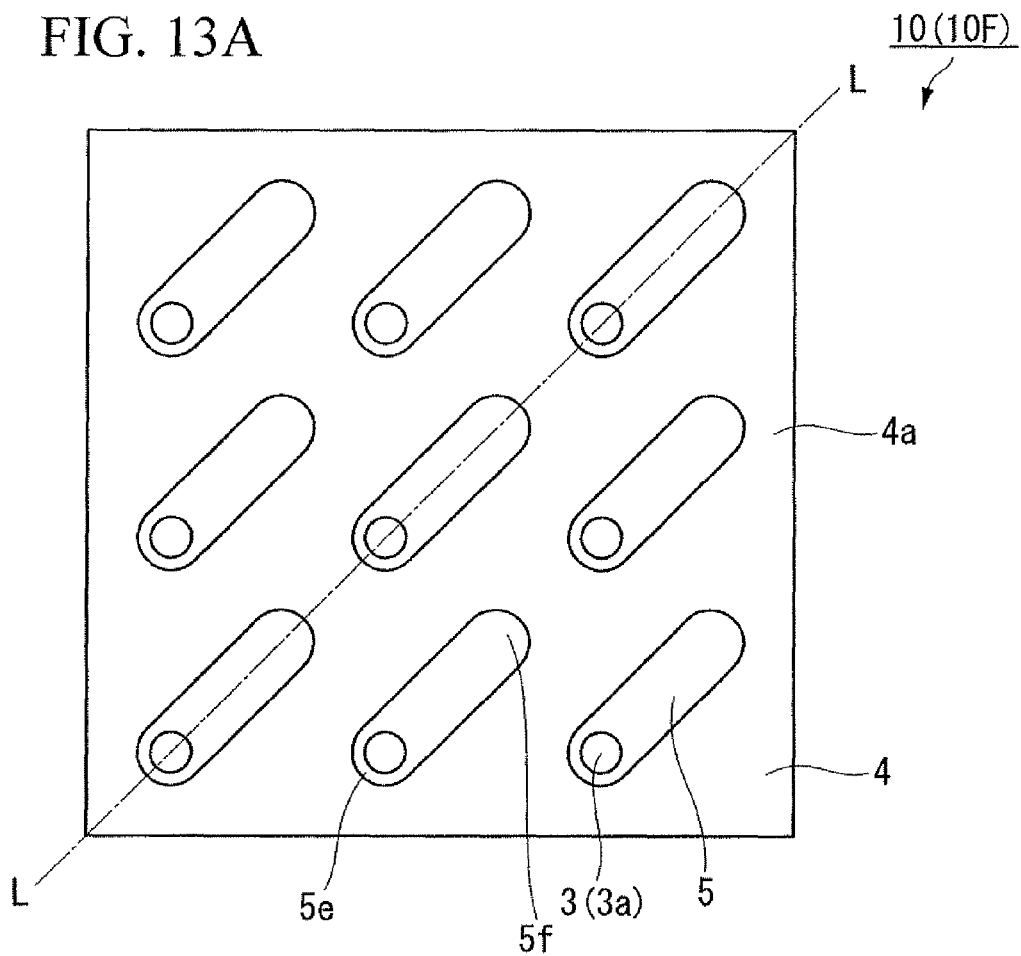
FIG. 13A is a plan view schematically showing an electronic component mounting board according to a sixth embodiment of the present invention.
Figure 13B:
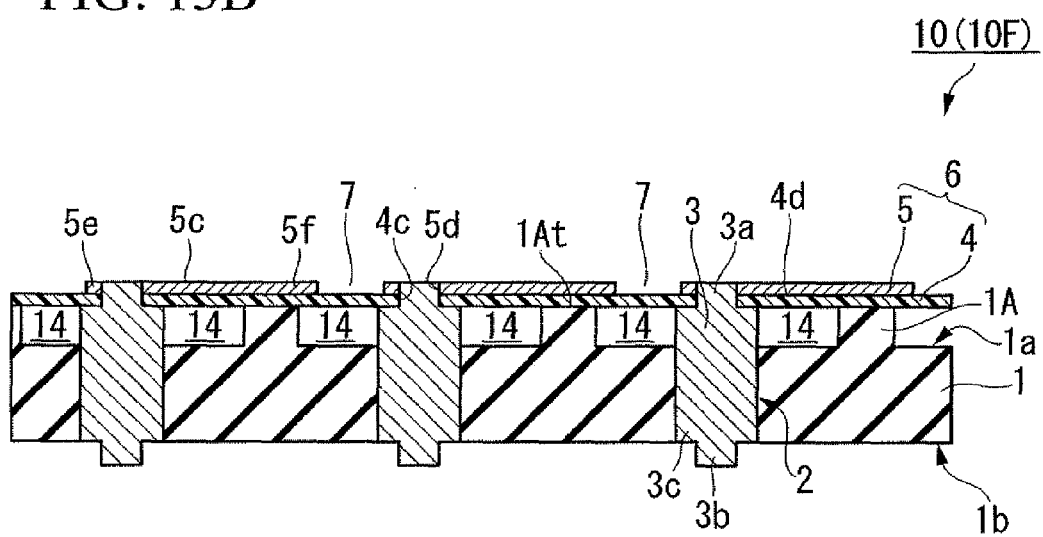
FIG. 13B is a cross-sectional view of FIG. 13A.

FIGS. 13A, 13B schematically show an electronic component mounting board 10 (10F) according to a sixth embodiment of the present invention. FIG. 13A is a top view thereof. FIG. 13B is a cross-sectional view of FIG. 13A taken along the line L-L.

The electronic component mounting board 10 (10F) of the present invention roughly includes: a substrate base 1 made of a plate-like elastic body with a plurality of projection portions 1A and through-holes 2, the projection portions 1A being arranged on a first surface 1a of the substrate base 1 in a manner spaced a predetermined distance apart from each other, and each of the through-holes 2 being arranged between the projection portions 1A; conductive members 3, each of which has a main unit portion 3c, in which at least a part of the main unit portion 3c is filled in the through-hole 2, a first end of the main unit portion 3c is on the same plane as a top surface 1At of the projection portion 1A, and the first end and a second end of the main unit portion 3c are provided respectively with a first protrusion portion 3a and a second protrusion portion 3b, with the first protrusion portion 3a arranged so as to protrude from a first surface 1a of the substrate base 1 and the second protrusion portion 3b arranged so as to protrude from a second surface 1b of the substrate base 1; and a structure 6 including a flexible substrate 4 and a plurality of oval electrodes 5, the substrate 4 being arranged on the first surface 1a side of the substrate base 1 so as to be in contact with the top surfaces of the projection portions and having first opening portions 4c for penetration of the first protrusion portions 3a, and each of the electrodes 5 being arranged on the substrate 4 and having a second opening portion 5d for penetration of the first protrusion portion 3a. The electrodes 5 are arranged with a spacing portion 7 therebetween. The second opening portion 5d is formed in the vicinity of a first end 5e side of the electrode 5. Hereunder is a detailed description of these constituent parts.

On the first surface 1a of the substrate base 1, the projection portions 1A are formed in a manner spaced a predetermined distance apart from each other. Here, the predetermined distance is, for example, a 0.5-mm pitch to a 1-mm pitch. Furthermore, the through-holes 2 for penetration of the conductive members 3 are arranged in the thickness direction of the substrate base 1. The through-hole 2 is provided between the projection portions 1A.

The projection portion 1A is made of the same material as that of the substrate base 1. The size and height of the projection portion 1A can be set through an appropriate adjustment according to a stroke amount required when an electronic component is mounted. As for the projection portion 1A, for example the height from the first surface 1a of the substrate base 1 to the top surface of the projection portion 1A is 50 to 300 m, the width is 100 μm to 500 μm. The shape thereof is not particularly limited so far as it can have an adequate stroke amount and can place the substrate 4 thereon with stability. For example, the shapes include: a circular cylinder, a multi-angle prism or a regular multi-angle prism such as a triangular prism and a quadratic prism; a truncated circular cone: and a truncated multi-sided pyramid or regular multi-sided pyramid such as a truncated triangular pyramid and a truncated quadrangular pyramid.

It is preferable that the projection portions 1A have the same height and that the top surfaces of the projection portions 1A be on the same plane. This allows the structure 6 to be placed on the top surfaces of the projection portions 1A with stability, leading to uniform a contact pressure with an electronic component.

A plurality of structures may be arranged on the first surface 1a of the substrate base 1. At this time, projection portions 1A may have different height and width for every structure 6.

With the projection portions 1A being arranged on the first surface 1a of the substrate base 1, it is possible to secure a sufficient stroke amount even if the elastomer used as the substrate base 1 has a high elasticity (hardness). That is, because a space 14 is provided around the projection portion 1A, the substrate base 1 (projection portion 1A) at a location that supports the electrode 5 is likely to be deformed. This allows an elastomer with high elasticity (hardness) to be used as the substrate base 1. Therefore, it is possible to make setting ranges of a load and a stroke amount wide, to thereby facilitate an optimal design of an electronic component mounting board.

In the present embodiment, at least a part of the main unit portion 3c of the conductive member 3 is arranged in the through-hole 2. The conductive member 3 is a pin-like one made of: a main unit portion 3c at least a part of which is filled in the through-hole 2; and the first protrusion portion 3a and the second protrusion portion 3b respectively arranged on the first end and the second end of the main unit portion 3c. Furthermore, the first end of the main unit portion 3c is on the same plane as the top surface 1At of the projection portion 1A. The first protrusion portion 3a protrudes to the first surface side of the substrate base 1, and the second protrusion portion 3b protrudes to the second surface 1b side of the substrate base 1.

The substrate 4 is arranged on the first surface 1a of the substrate base 1 so as to be in contact with the top surfaces 1At of the projection portions 1A.

The plurality of electrodes 5 are arranged on the first surface 4d of the substrate 4. Between the electrodes 5, the spacing portion 7 is provided. The electrode 5 has an oval shape. In the first end side 5e thereof, the second opening portion 5d is provided from which the first protrusion portion 3a of the conductive member 3 is exposed. On the other hand, the second end 5f sides of the electrodes 5 (the sides in contact with conductive portions of an electronic component)

arranged on the first surface 1a of the substrate base 1 overlap the top surfaces 1At of the projection portions 1A.

FIG. 14A to FIG. 16B schematically show a manufacturing method of an electronic component mounting board 10F of the present invention.

Figure 14A:
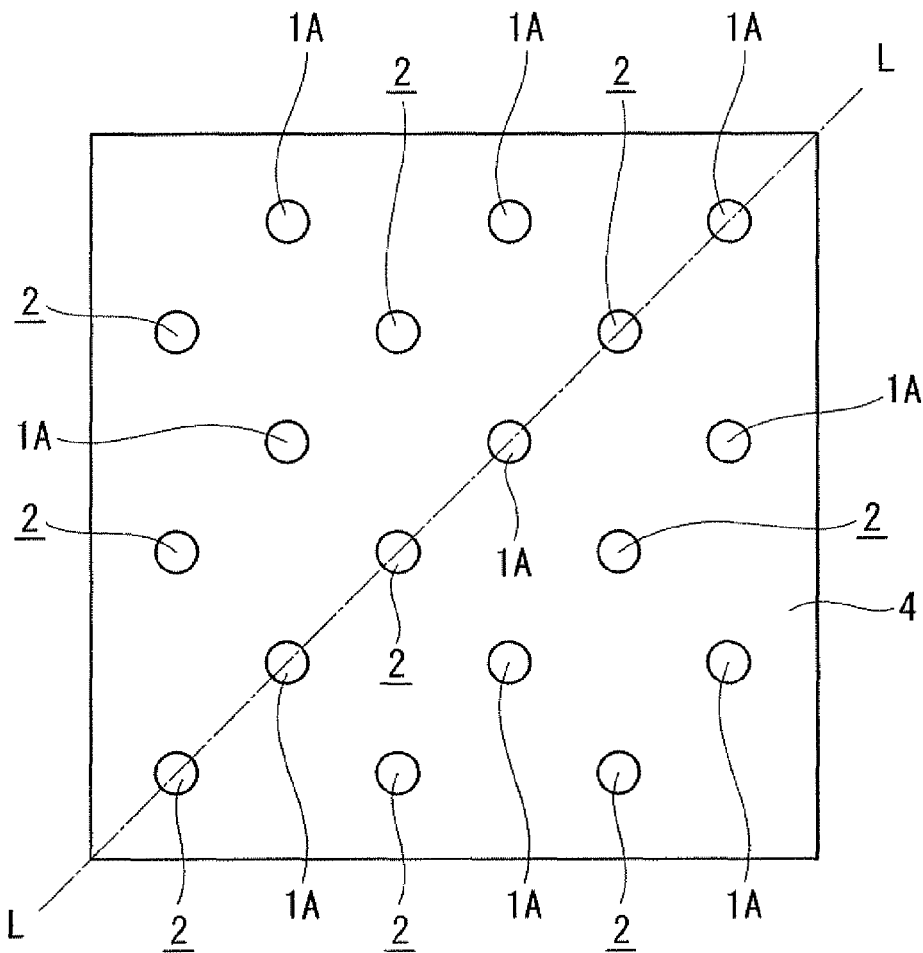
FIG. 14A is a plan view of a first step schematically showing a manufacturing method of the electronic component mounting board according to the embodiment.
Figure 14B:
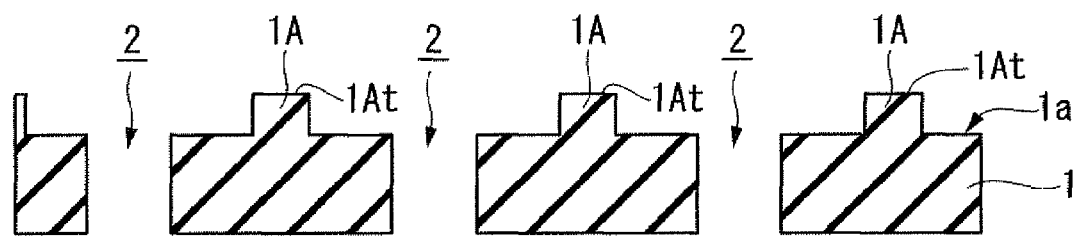
FIG. 14B is a cross-sectional view of FIG. 14A.

First, as shown in FIGS. 14A, 14B, a substrate base 1 with a plurality of projection portions 1A on a first surface 1a and with a through-hole 2 between the projection portions 1A is formed. FIG. 14A is a top view thereof. FIG. 14B is a cross-sectional view of FIG. 14A taken along the L-L line.

It is possible to simply fabricate the substrate base 1 with the projection portions 1A and the through-holes 2 by using an injection molding technique with a mold. Alternatively, a sheet-like substrate base 1 with the projection portions 1A may be molded and then be subjected to boring machining with laser or by machining to form the through-holes 2.

Figure 15A:
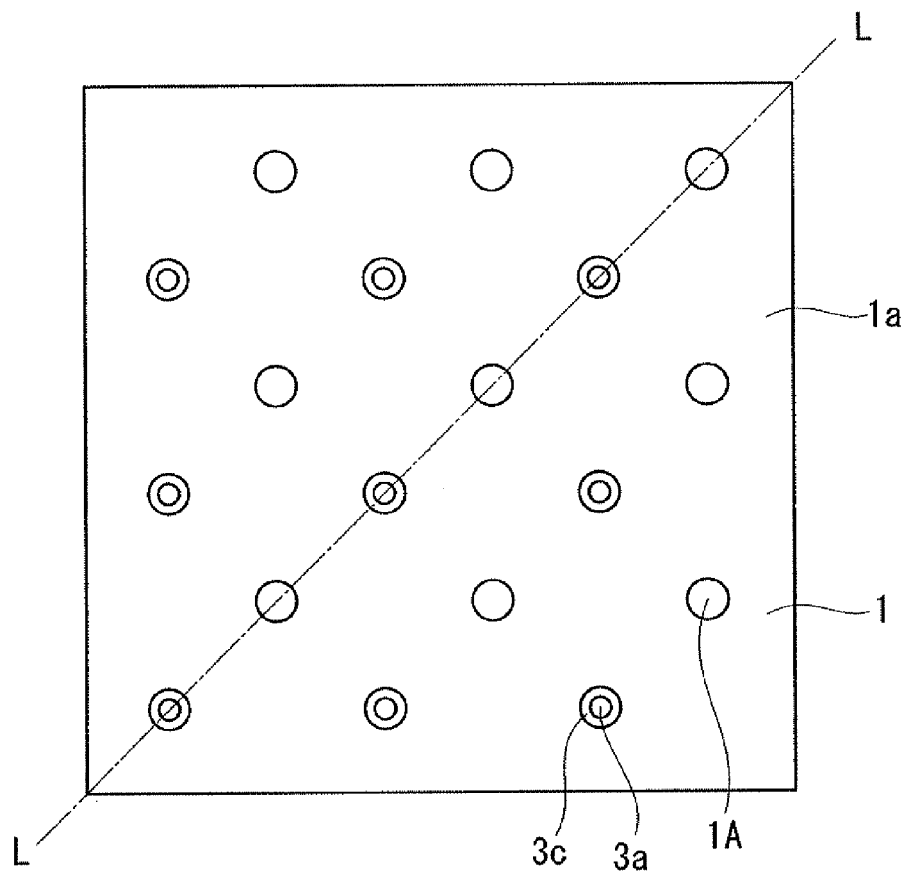
FIG. 15A is a plan view of a second step schematically showing a manufacturing method of the electronic component mounting board according to the embodiment.
Figure 15B:
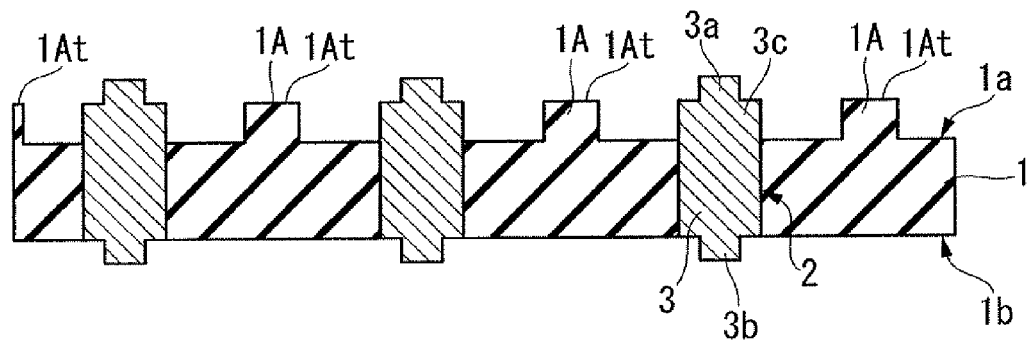
FIG. 15B is a cross-sectional view of FIG. 15A.

Next, as shown in FIGS. 15A, 15B, main unit portions 3c of conductive members 3 are inserted into the through-holes 2 fabricated in FIGS. 14A, 14B so that first protrusion portions 3a and second protrusion portions 3b of the conductive members 3 protrude respectively from the first surface 1a and the second surface 1b of the substrate base 1. At this time, the first protrusion portions 3a are caused to protrude further than top surfaces 1At of the projection portions 1A arranged on the first surface 1a of the substrate base 1. FIG. 15A is a top view thereof. FIG. 15B is a cross-sectional view of 4A taken along the line L-L.

As methods of inserting the conductive members 3 into the through-holes 2, a press fitting, an insert molding, and the like are used in general. However, the method is not particularly limited so long as the conductive members 3 can be inserted into the through-holes 2 of the substrate base 1 without damage.

Figure 16A:
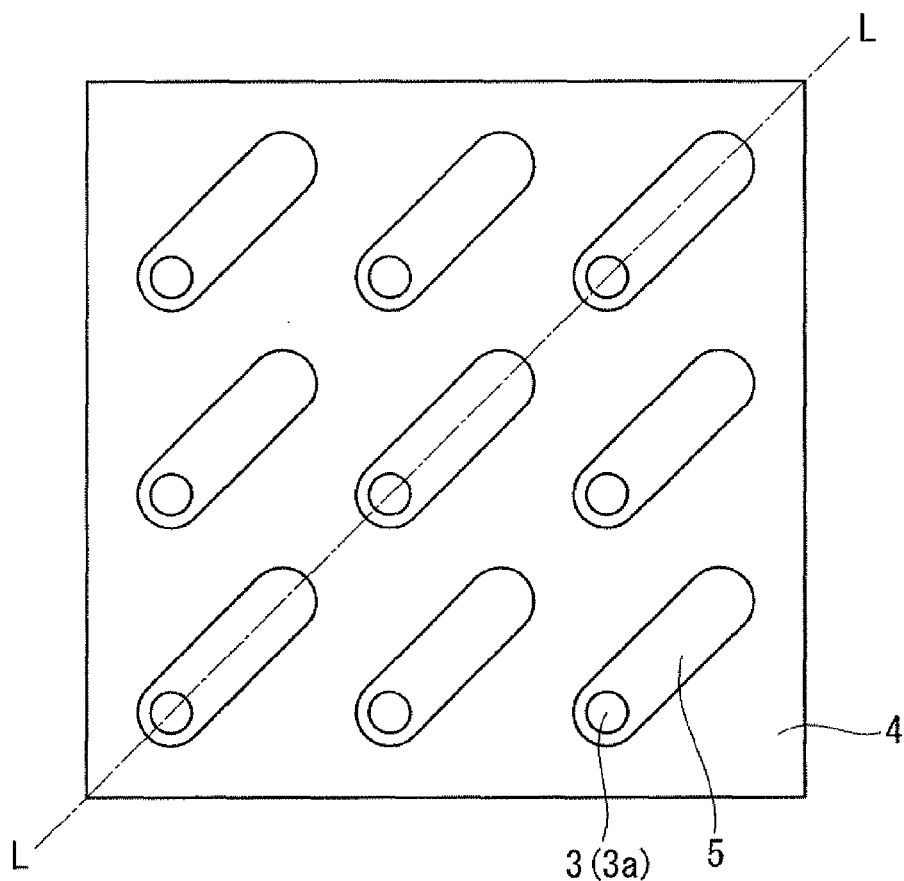
FIG. 16A is a plan view of a third step schematically showing a manufacturing method of the electronic component mounting board according to the embodiment.
Figure 16B:
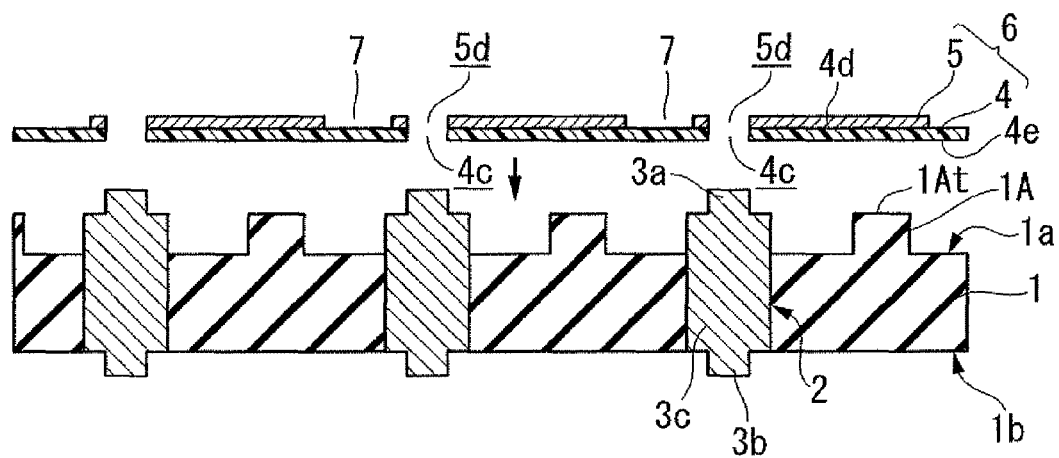
FIG. 16B is a cross-sectional view of FIG. 16A.

Next, as shown in FIGS. 16A, 16B, a plurality of electrodes 5 are formed in a first surface 4d of a substrate 4. In addition, first opening portions 4c for penetration of the first protrusion portions 3a of the conductive members 3 are fabricated in the substrate 4, and second opening portions 5d are fabricated in the electrodes 5, to thereby form a structure 6. Alternatively, the first opening portions 4c may be first formed in the substrate 4, and then the electrodes 5 may be formed so as to have the second opening portions 5d. FIG. 16A is a top view thereof. FIG. 16B is a cross-sectional view of 16A taken along the line L-L.

The formation method of the structure 6 is similar to that of the aforementioned first embodiment.

After that, the first protrusion portions 3a of the conductive members 3 are inserted into the first opening portions 4c and the second opening portions 5d, to thereby arrange the structure 6 so that the top surfaces 1At of the projection portions 1A arranged on the first surface 1a of the substrate base 1 are brought into contact with the second surface 4e of the substrate 4.

As described above, the electronic component mounting board 10F of the present invention as shown in FIGS. 13A, 13B is obtained.

Figure 17:
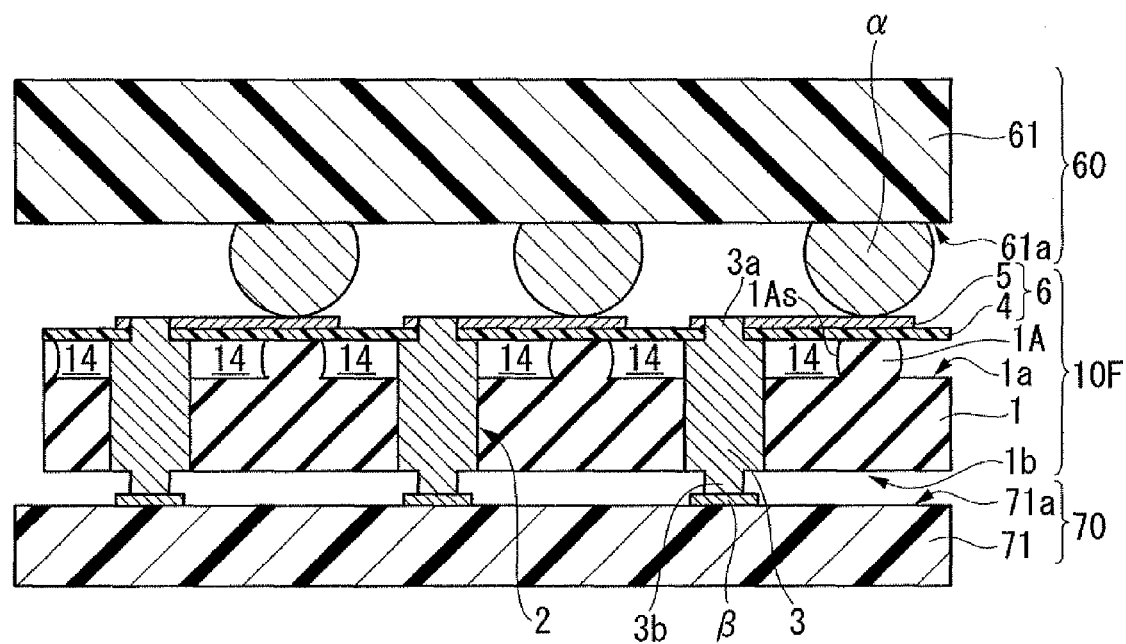
FIG. 17 is a cross-sectional view schematically showing one example in which electronic components are mounted by use of the electronic component mounting board according to the embodiment.

FIG. 17 is a cross-sectional view schematically showing one example of an electronic component obtained by using the electronic component mounting board 10F of the present embodiment to mount an electronic component 60 (for example, a semiconductor electronic circuit 60) onto a circuit board 70. Each solder bump α arranged on a first surface 61a of a first base material 61 of the electronic component 60 is in contact with each electrode 5, and each second protrusion portion 3b of each conductive member 3 is in contact with each conductive portion β arranged on a first surface of a second base material 71 of the circuit board 70. Thereby, each solder bump α and each conductive portion β are electrically connected.

The electronic component 60 and the circuit board 70 are similar to those of the aforementioned first embodiment.

It is preferable that the location at which the solder bump α comes in contact with the electrode 5 be on the second end 5f side of the electrode 5 and above the projection portion 1A of the substrate base 1. When the electrode 5 is brought into contact with the solder bump α, the projection portion 1A is elastically deformed, to thereby curve a side surface 1As of the projection portion 1A, as shown in FIG. 17. In this manner, the projection portions 1A are deformed to make the contact pressure between the electrodes 5 and the solder bumps α proper. Thereby, it is possible to bring the electrodes 5 and the solder bumps α into contact with each other with a proper load.

According to the present invention, it is possible to appropriately adjust a stroke amount simply by varying the size, hardness, and shape of the projection portion 1A. Therefore, according to the electronic component to be mounted, contact locations between the solder bumps α and the electrodes 5 are changed to obtain a proper stroke amount, to thereby make it possible to secure a sufficient contact pressure between the solder bumps α and the electrodes 5. As a result, it is possible to suppress poor conduction and an increase in contact resistance.

The solder bumps α and the like are brought into contact with the electrodes 5 and apply a pressure. Thereby, oxide layers formed on the surfaces of the solder bumps α and the electrodes 5 are broken by the wiping effect. As a result, it is possible to improve conductivity.

Seventh Embodiment

Figure 18A:
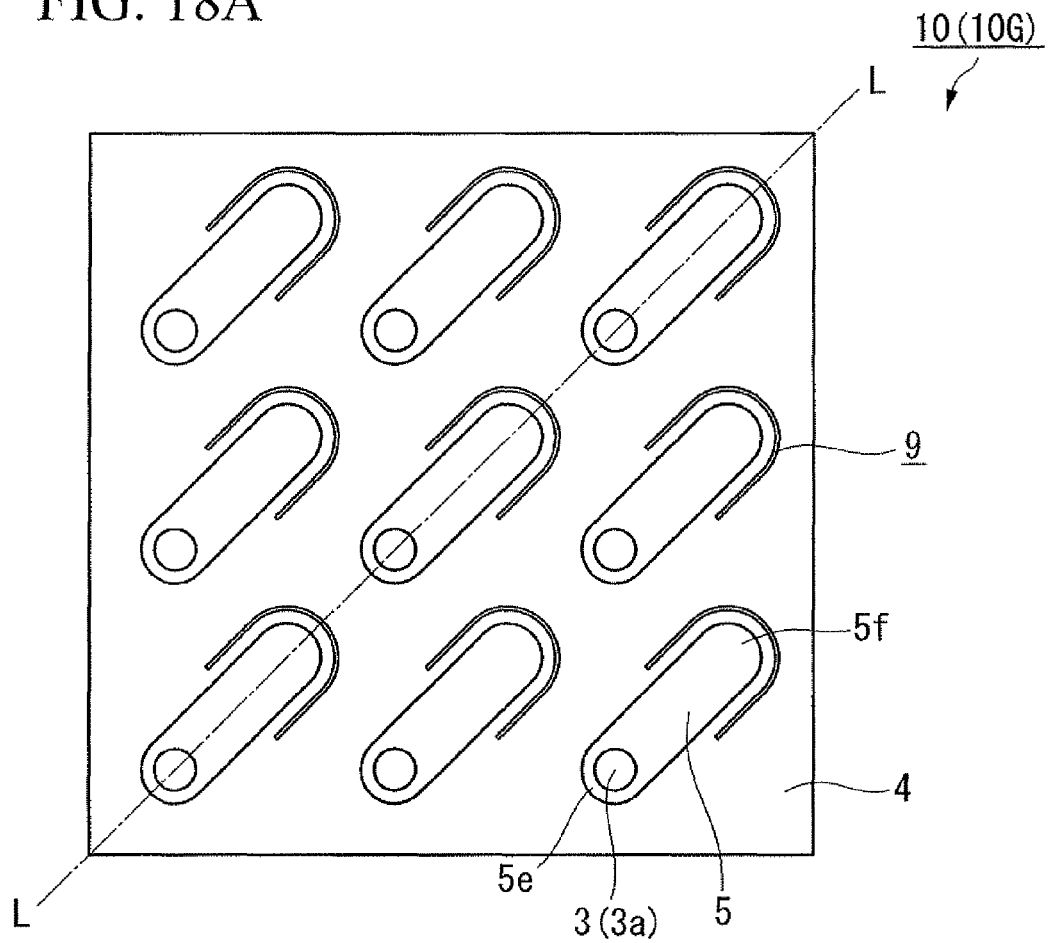
FIG. 18A is a plan view schematically showing an electronic component mounting board according to a seventh embodiment of the present invention.
Figure 18B:
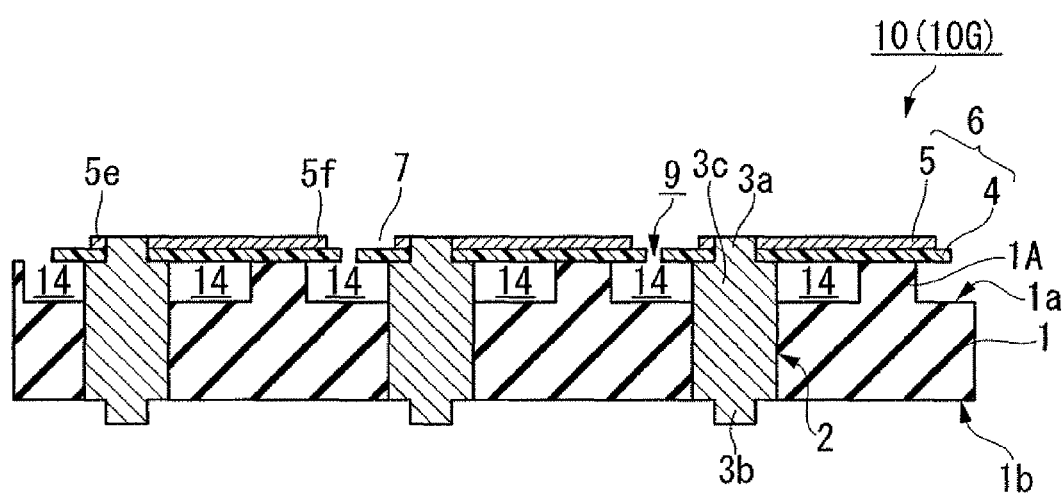
FIG. 18B is a cross-sectional view of FIG. 18A.

FIGS. 18A, 18B schematically show an electronic component mounting board 10 (10G) according to a seventh embodiment of the present invention. Like constituent parts to those of the sixth embodiment may be designated with like reference numerals and may not be repetitiously explained. FIG. 18A is a top view thereof. FIG. 18B is a cross-sectional view of FIG. 18A taken along the line L-L. The difference between the present embodiment and the sixth embodiment lies in that slits 9 are arranged on the substrate 4, each along the shape of the second end 5f side of the electrode 5.

The slit 9 may be arranged so as to surround at least an outer circumference of a second end 5f side of the electrode 5. With the slits 9, the stroke amount of the electrode 5 is increased, to thereby make it possible to further absorb irregularities in height of the solder bumps α when the electronic component 60 is mounted, similarly to the case of the sixth embodiment. Therefore, with the substrate base 1 and the projection portions 1A provided on the first surface 1a of the substrate base 1, it is possible to adjust a contact pressure between the electrodes 5 and solder bumps α of the electronic component 60 in a wider area. As a result, it is possible to further uniform the heights of the electronic component, and hence suppress poor contact and the like more effectively.

To fabricate such slits 9 in the substrate 4, the substrate 4 is machined with a boring machine or with laser. Thereby, it is possible to simply provide the slits 9, with favorable accuracy.

Figure 19:
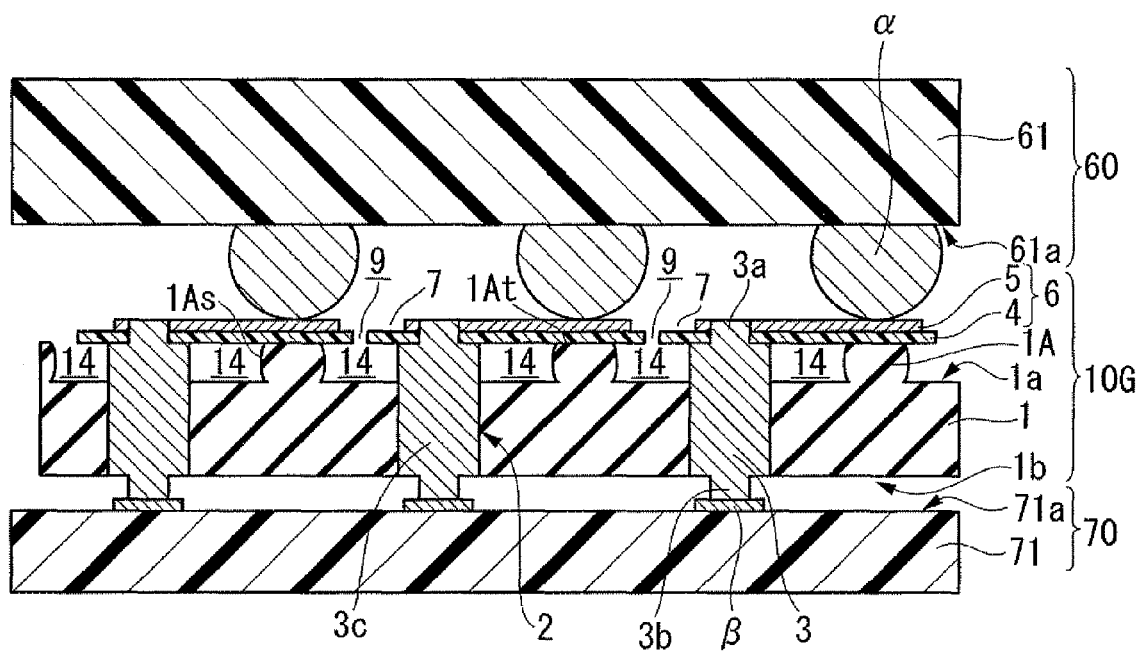
FIG. 19 is a cross-sectional view schematically showing one example in which electronic components are mounted by use of the electronic component mounting board according to the embodiment.

FIG. 19 is a cross-sectional view schematically showing one example where the electronic component mounting board 10 (10G) of the present embodiment is used to mount an electronic component 60 (for example, a semiconductor electronic circuit 60) onto a circuit board 70. With the slits 9 being arranged, the structure 6 operates more flexibly to elastically deform the projection portions 1A when the electronic component 60 is mounted. As a result, it is possible to further absorb irregularities in height of the solder bumps α and the like.

Eighth Embodiment

Figure 20A:
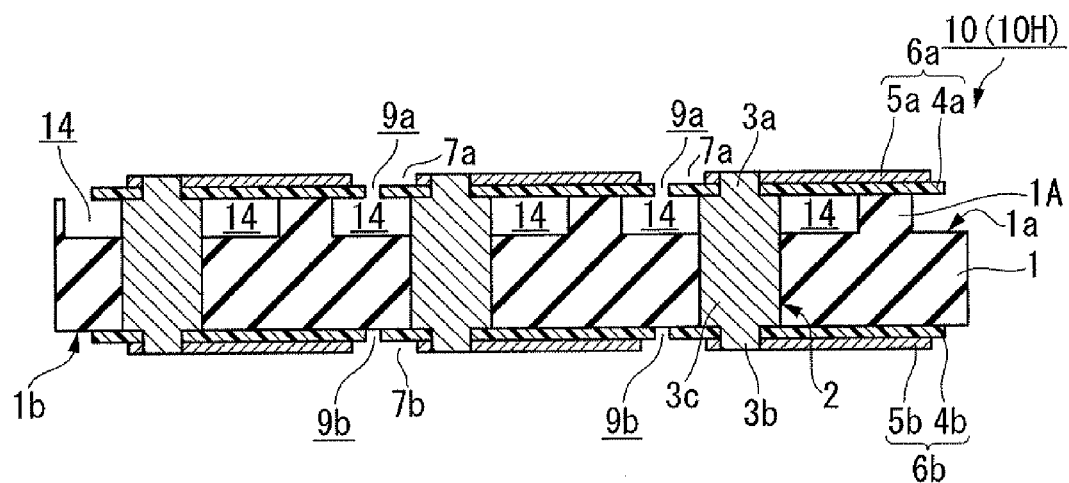
FIG. 20A is a cross-sectional view schematically showing an electronic component mounting board according to an eighth embodiment of the present invention.
Figure 20B:
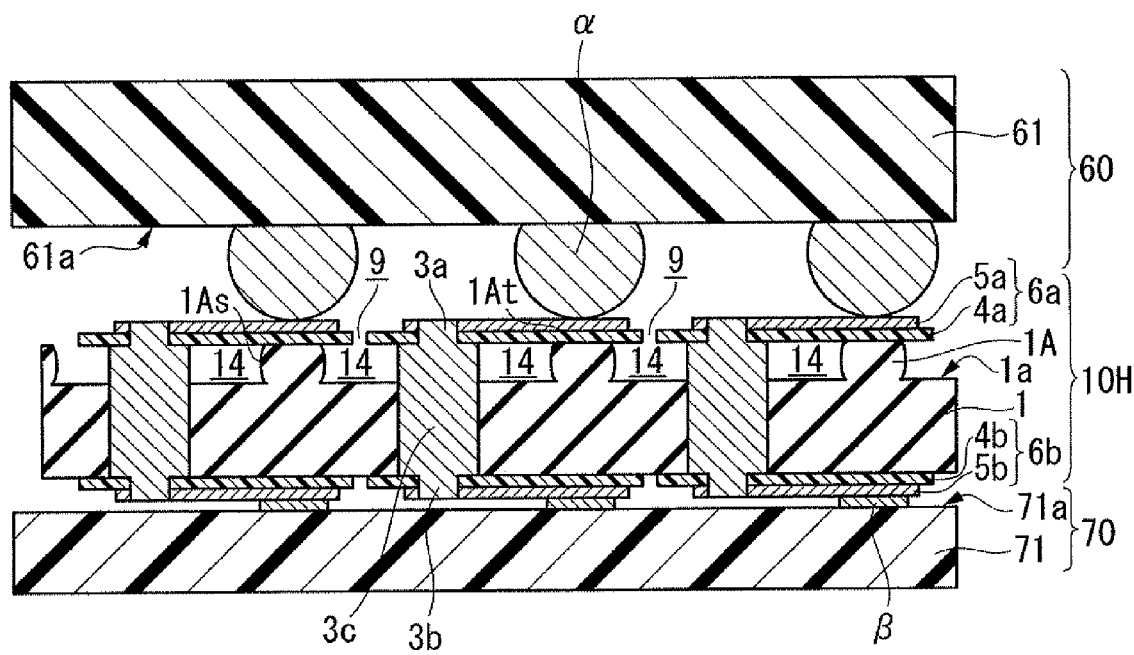
FIG. 20B is a cross-sectional view schematically showing one example in which electronic components are mounted by use of the electronic component mounting board according to the embodiment.

FIGS. 20A, 20B are cross-sectional views schematically showing an electronic component mounting board 10 (10H) according to an eighth embodiment of the present invention. Like constituent parts to those of the sixth embodiment or the seventh embodiment may be designated with like reference numerals and may not be repetitiously explained. FIG. 20A is a cross-sectional view similar to that of the sixth embodiment or the seventh embodiment. FIG. 20B is a cross-sectional view schematically showing one example where the electronic component mounting board of the present embodiment is used to mount an electronic component 60 (for example, a semiconductor electronic circuit 60) onto a circuit board 70. The difference between the present embodiment and the seventh embodiment lies in that a structure 6 is arranged also on the second surface 1b of the substrate base 1.

With the substrates 4 (4a, 4b) on which electrodes 5 (5a, 5b) are arranged, that is, structures 6 (6a, 6b) being provided on both sides 1a, 1b of the substrate base 1 as in the present embodiment, it is possible to further absorb irregularities in height on both sides of the substrate base 1 when an electronic component or the like is mounted. Therefore, it is possible to mount the electronic component 60 and circuit board 70 with irregularities in height onto both sides of the substrate base 1, thus allowing for assembly of an electronic circuit unit with a high degree of design.

FIGS. 20A, 20B show the electronic component mounting board where the slits 9 are provided in the substrates 4 (4a, 4b) arranged on both sides of the substrate base 1. However, in the case where a required stroke amount is small, the slits 9 may not be provided in the substrates 4 similarly to the case of the sixth embodiment, or the slits 9 may be provided in only either one of the substrates 4a, 4b.

FIG. 20B is a cross-sectional view schematically showing one example where the electronic component mounting board 10H of the present embodiment is used to mount an electronic component 60 (for example, a semiconductor electronic circuit 60) onto a circuit board 70.

Each solder bump α arranged on the semiconductor electronic circuit 60 is in contact with each electrode 5a arranged on a first surface 1a of a substrate base 1, and each electrode 5b arranged on a second surface 1b of the substrate base 1 is in contact with each conductive portion β of the circuit board 70. Thereby, each solder bump α and each conductive portion β are electrically connected. In the case where the electronic component mounting board 10H of the present embodiment is used, the advantage similar to that of the aforementioned sixth embodiment and seventh embodiment is obtained. In addition, because the structures 6 (6a, 6b) are arranged on both sides of the substrate base 1, it is possible to mount the circuit board 70 with irregularities in height onto both sides of the substrate base 1, to thereby make it possible to obtain an electronic circuit unit with a high degree of design. Furthermore, the conductive portions β are brought into contact with the electrodes 5b and apply a pressure. Thereby, oxide layers formed on the surfaces of the conductive portions β and the electrodes 5b are broken by the wiping effect. As a result, it is possible to improve conductivity.

Ninth Embodiment

Figure 21A:
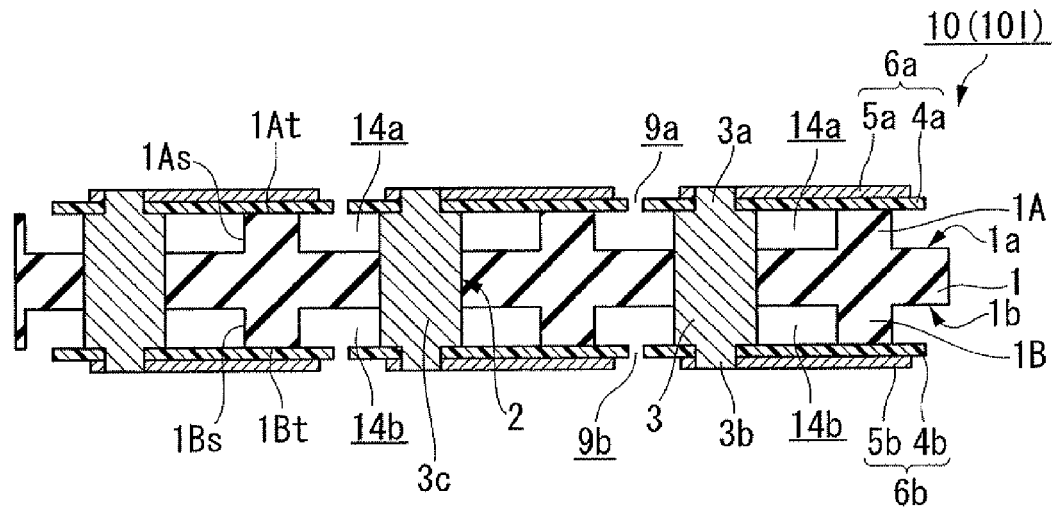
FIG. 21A is a cross-sectional view schematically showing an electronic component mounting board according to a ninth embodiment of the present invention.
Figure 21B:
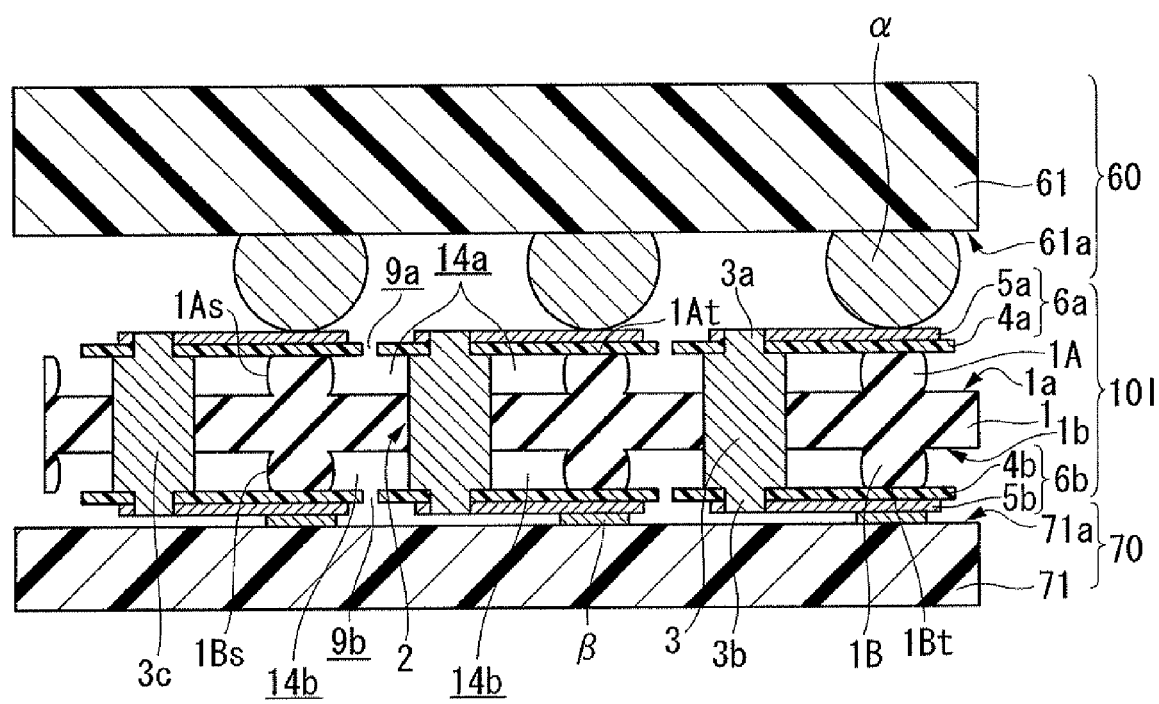
FIG. 21B is a cross-sectional view schematically showing one example in which electronic components are mounted by use of the electronic component mounting board according to the embodiment.

FIGS. 21A, 21B are cross-sectional views schematically showing an electronic component mounting board 10 (10I) according to a ninth embodiment of the present invention. Like constituent parts to those of the sixth embodiment to the eighth embodiment may be designated with like reference numerals and may not be repetitiously explained. FIG. 21A is a cross-sectional view similar to that of the sixth embodiment or the seventh embodiment. FIG. 21B is a cross-sectional view schematically showing one example where the electronic component mounting board of the present embodiment is used to mount an electronic component 60 (for example, a semiconductor electronic circuit 60) onto a circuit board 70. The difference between the present embodiment and the eighth embodiment lies in that projection portions 1B are arranged also on the second surface 1b of the substrate base 1 and that a structure 6b is arranged so as to be in contact with top surfaces 1Bt of the projection portions 1B.

The projection portion 1B arranged on the second surface 1b of the substrate base 1 is similar to the projection portion 1A of the aforementioned sixth embodiment. Therefore, it is possible to appropriately adjust the height size, and shape of the projection portion 1B according to the thickness, hardness, and the like of the electronic component, circuit board, or substrate base 1 that is to be mounted. In FIGS. 21A, 21B, the projection portions 1A and the projection portions 1B are arranged at the same locations of the first surface 1a and the second surface 1b of the substrate base 1, respectively. However, the arrangement is not particularly limited to this. The projection portions 1A and the projection portions 1B may be arranged at different locations on the first surface 1a and the second surface 1b, respectively.

With the projection portions (1A, 1B) being provided on the first surface 1a and the second surface 1b of the substrate base 1 as in the present embodiment, the stroke amount is increased more than that of the electronic component mounting board 10H of the eighth embodiment. Therefore, it is possible to absorb irregularities in height of the conductive portions in a wider area, the conductive portions being arranged in the electronic component and circuit board to be mounted. Consequently, it is possible to obtain an electronic component mounting board suitable for the electronic component and circuit board to be mounted, in a wider range of conditions.

FIGS. 21A, 21B show the electronic component mounting board where the slits 9 are provided in the substrates 4. However, in the case where a required stroke amount is small, the slits 9 may not be provided in the substrates 4 similarly to the case of the case of the sixth embodiment.

Tenth Embodiment

Figure 22A:
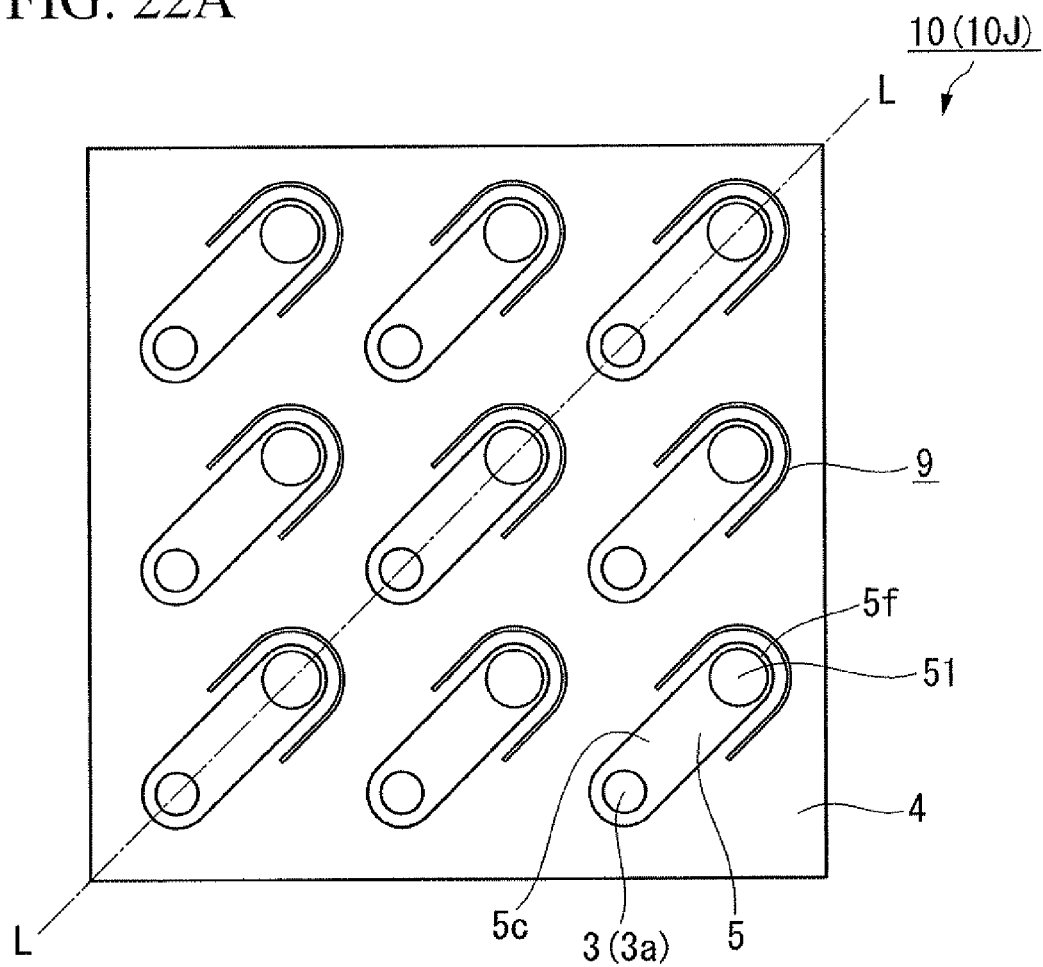
FIG. 22A is a plan view schematically showing an electronic component mounting board according to a tenth embodiment of the present invention.
Figure 22B:
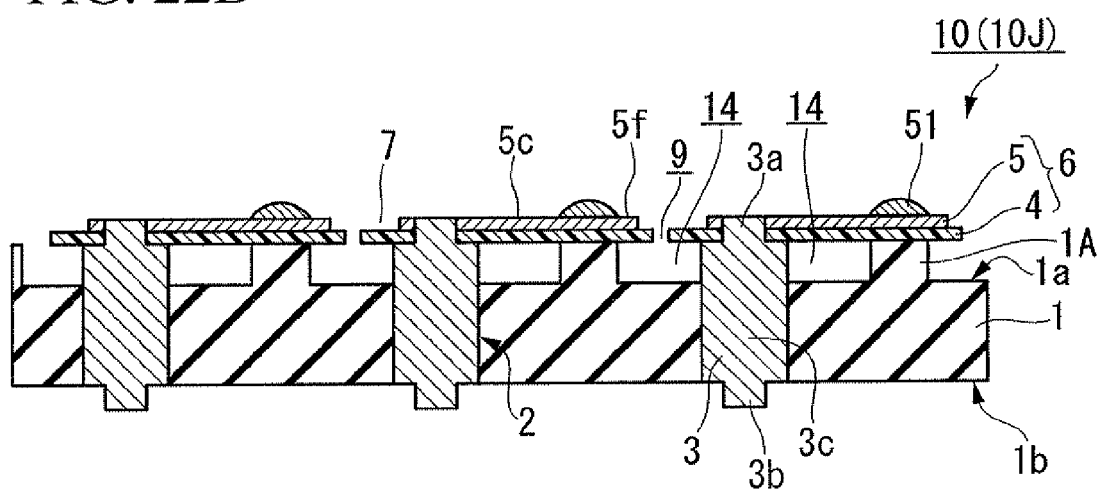
FIG. 22B is a cross-sectional view of FIG. 22A.

FIGS. 22A, 22B schematically show an electronic component mounting board 10 (10J) according to a tenth embodiment of the present invention. FIG. 22A is a top view thereof. FIG. 22B is a cross-sectional view of FIG. 22A taken along the line L-L. The difference between the present embodiment and the seventh embodiment lies in that a bump portion 51 is arranged on a first surface 5c of an electrode 5 and also on a second end 5f side of the electrode 5. The bump portion 51 is similar to that of the aforementioned fourth embodiment.

With the bump portions 51 being provided in this manner, it is possible to make a contact pressure with the electronic component 60 larger than that of the seventh embodiment. Therefore, it is possible to suppress poor contact more efficiently.

FIGS. 22A, 22B show the electronic component mounting board where the slits 9 are provided in the substrate 4. However, in the case where a required stroke amount is small, the slits 9 may not be provided in the substrate 4 similarly to the case of the sixth embodiment.

Figure 23A:
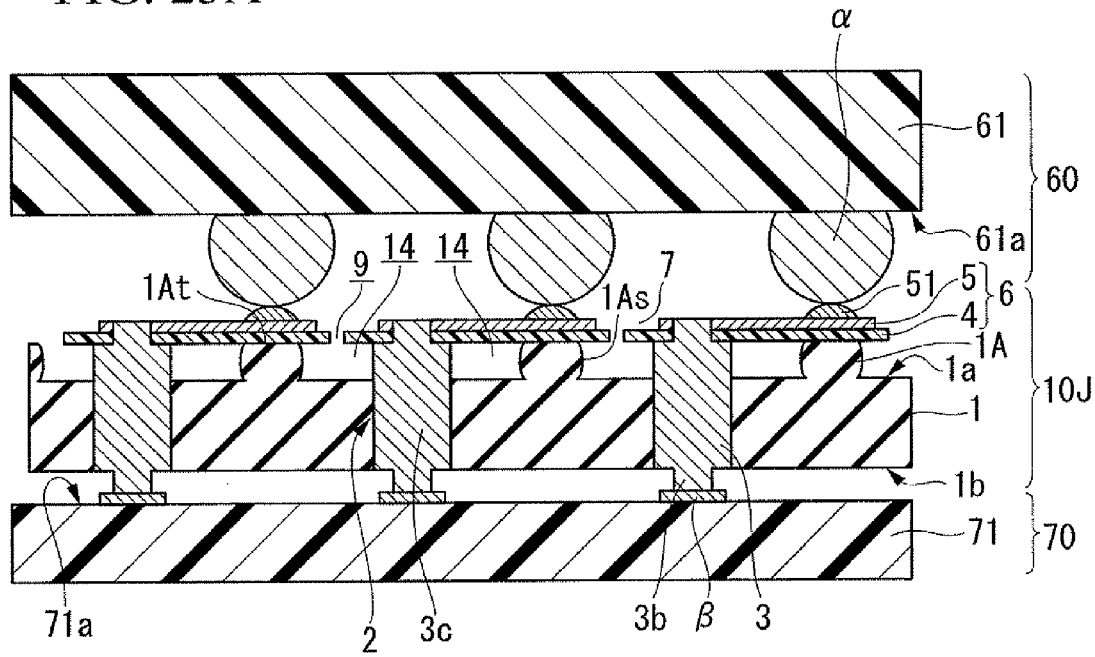
FIG. 23A is a cross-sectional view schematically showing one example in which electronic components are mounted by use of the electronic component mounting board according to the embodiment.

FIG. 23A is a cross-sectional view schematically showing one example where the electronic component mounting board 10J of the present embodiment is used to mount an electronic component 60 (for example, a semiconductor electronic circuit 60) onto a circuit board 70. Each solder bump α arranged on a first surface of the semiconductor electronic circuit 60 is in contact with a bump portion 51 arranged on each electrode 5, and a second protrusion portion 3b of each conductive member 3 is in contact with each conductive portion β arranged on the circuit board 70. Thereby, each solder bump α and each conductive portion β are electrically connected. With such contacts via the bump portions 51, it is possible to make contact pressure large. As a result, it is possible to suppress poor contact more effectively. Furthermore, because the wiping effect on contact surfaces between the bump portions 51 and the solder bumps α becomes strong. Therefore, the oxide layers formed on the surfaces of the bump portions 51 and the solder bumps α become likely to be broken, making it possible to improve conductivity.

Eleventh Embodiment

Figure 23B:
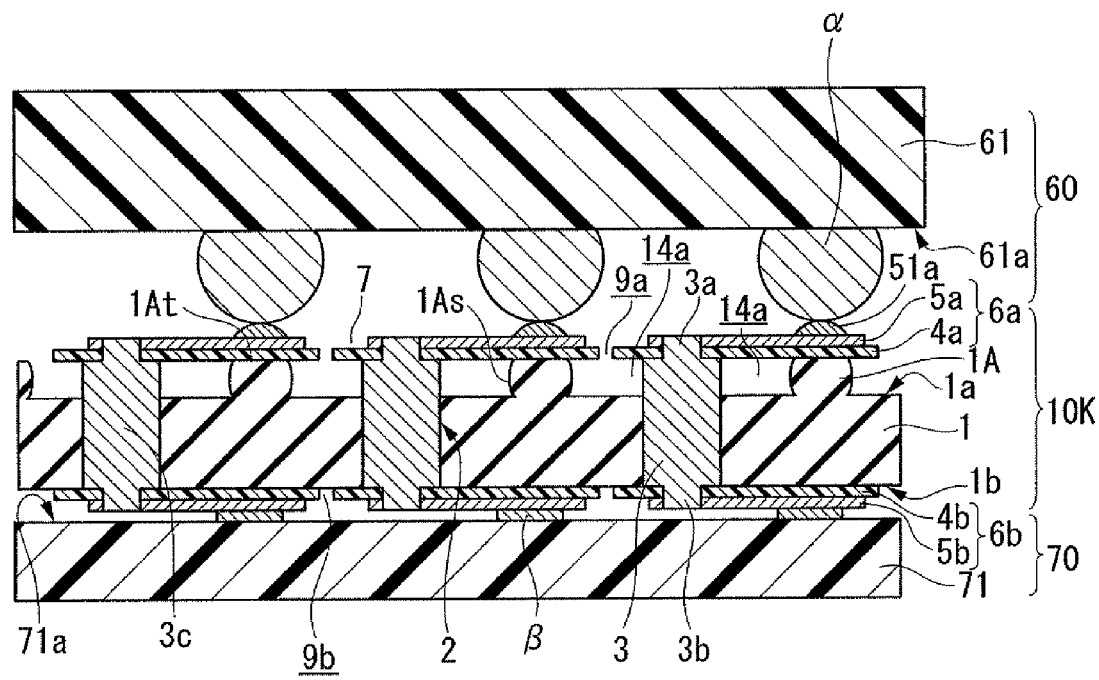
FIG. 23B is a cross-sectional view schematically showing one example in which electronic components are mounted by use of the electronic component mounting board according to an eleventh embodiment.

FIG. 23B is a cross-sectional view schematically showing one example where an electronic component mounting board 10K according to an eleventh embodiment is used to mount an electronic component 60 (for example, a semiconductor electronic circuit 60) onto a circuit board 70, the electronic component mounting board 10K being the electronic component mounting board 10H of the eighth embodiment in which a bump portion 51 is similarly provided on every electrode 5a. Also in this case, the advantage similar to that of the aforementioned electronic component mounting board 10J is obtained. Furthermore, with a structure 6 being provided also on the second surface 1b of the substrate base 1, it is possible to amount a circuit board 70 with irregularities in height of the conductive portions β on both sides of the substrate base 1. Therefore, it is possible to assemble an electronic circuit unit with a high degree of design.

Twelfth Embodiment

Figure 24A:
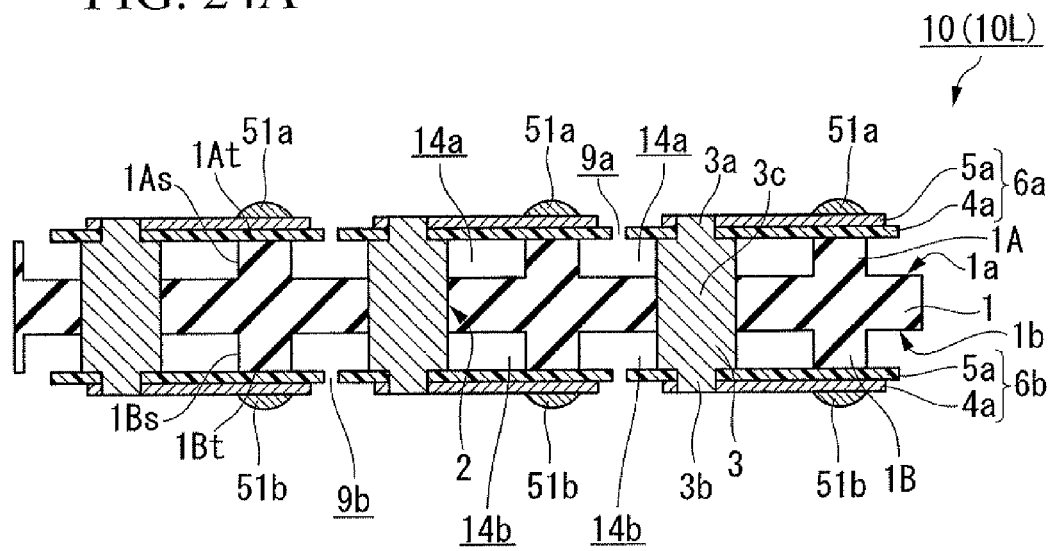
FIG. 24A is a cross-sectional view schematically showing an electronic component mounting board according to a twelfth embodiment of the present invention.
Figure 24B:
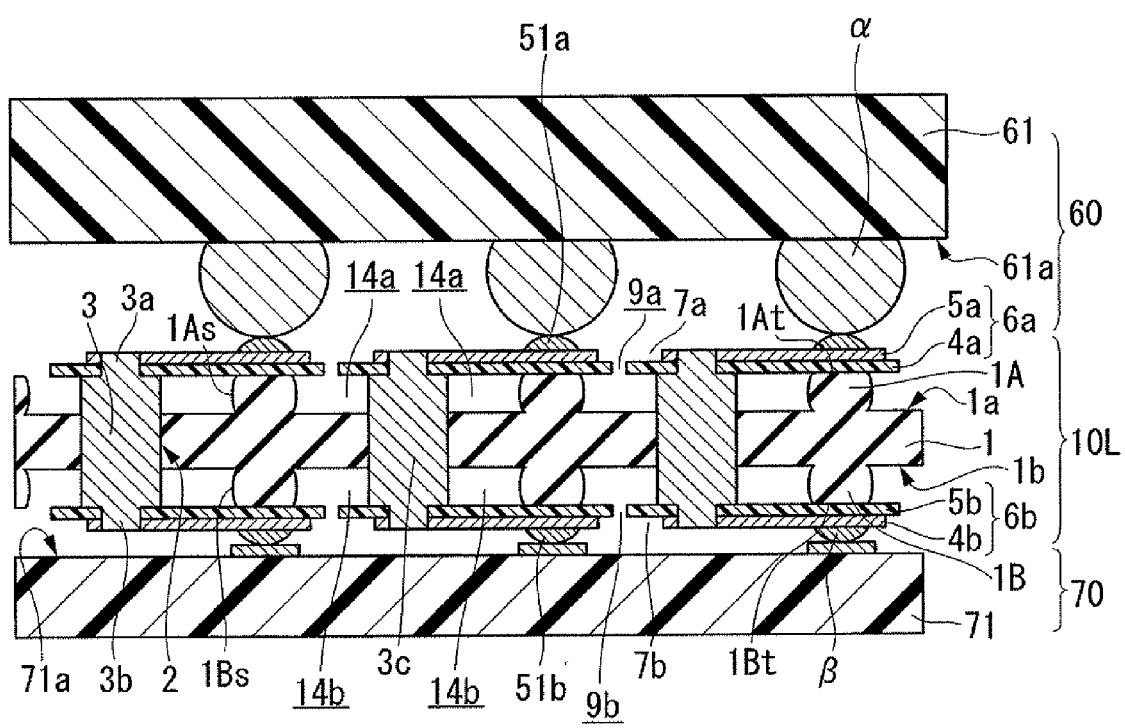
FIG. 24B is a cross-sectional view schematically showing one example in which electronic components are mounted by use of the electronic component mounting board according to the embodiment.

FIGS. 24A, 24B schematically show an electronic component mounting board 10 (10L) according to a twelfth embodiment of the present invention. FIG. 24A is a cross-sectional view schematically showing the electronic component mounting board similarly to the case of the case of the aforementioned sixth embodiment to ninth embodiment. The plan view (top view) thereof is omitted because it is similar to that of the tenth embodiment.

The difference between the present embodiment and the ninth embodiment lies in that bump portions 51 (51a, 51b) are provided on the electrodes 5 (5a, 5b) of the structures 6 (6a, 6b) arranged on both sides of the substrate base 1 at contact points with the electronic component. The bump portion 51 is similar to that of the ninth embodiment.

According to the present embodiment, with the bump portions 51 being provided, it is possible to make a contact pressure with the electronic component 60 and with the circuit board 70 large. As a result, it is possible to suppress poor contact more effectively.

FIGS. 24A, 24B show the electronic component mounting board where the slits 9 are provided in the substrates 4 (4a, 4b) arranged on both sides 1a, 1b of the substrate base 1. However, in the case where a required stroke amount is small, the slits 9 may not be provided in the substrates 4 (4a, 4b) similarly to the case of the first embodiment, or the slits 9 may be provided in only either one of the substrates 4a, 4b.

FIG. 24B is a cross-sectional view schematically showing one example where the electronic component mounting board 10L of the present embodiment is used to mount an electronic component 60 (for example, a semiconductor electronic circuit 60) onto a circuit board 70. Each solder bump α arranged on a first surface of the semiconductor electronic circuit 60 is in contact with a bump portion 51a arranged on each electrode 5a, and each conductive portion β arranged on the circuit board 70 is in contact with a bump portion 51b arranged on each electrode 5b of a substrate base 1. Thereby, each solder bump α and each conductive portion β are electrically connected. With the bump portions 51 (51a, 51b) being provided respectively on the electrodes 5 (5a, 5b) arranged on both sides of the substrate base 1 in this manner, it is possible to make a contact pressure with the electronic component 60 and with the circuit board 70 large. As a result, it is possible to suppress poor contact more effectively. Furthermore, the wiping effect on contact surfaces between the bump portions 51a and the solder bumps α, and between the bump portions 51b and the conductive portions β becomes strong. Therefore, the oxide layers formed on the surfaces of the bump portions 51 and the solder bumps α become likely to be broken, making it possible to improve conductivity.

Thirteenth Embodiment

Figure 25:
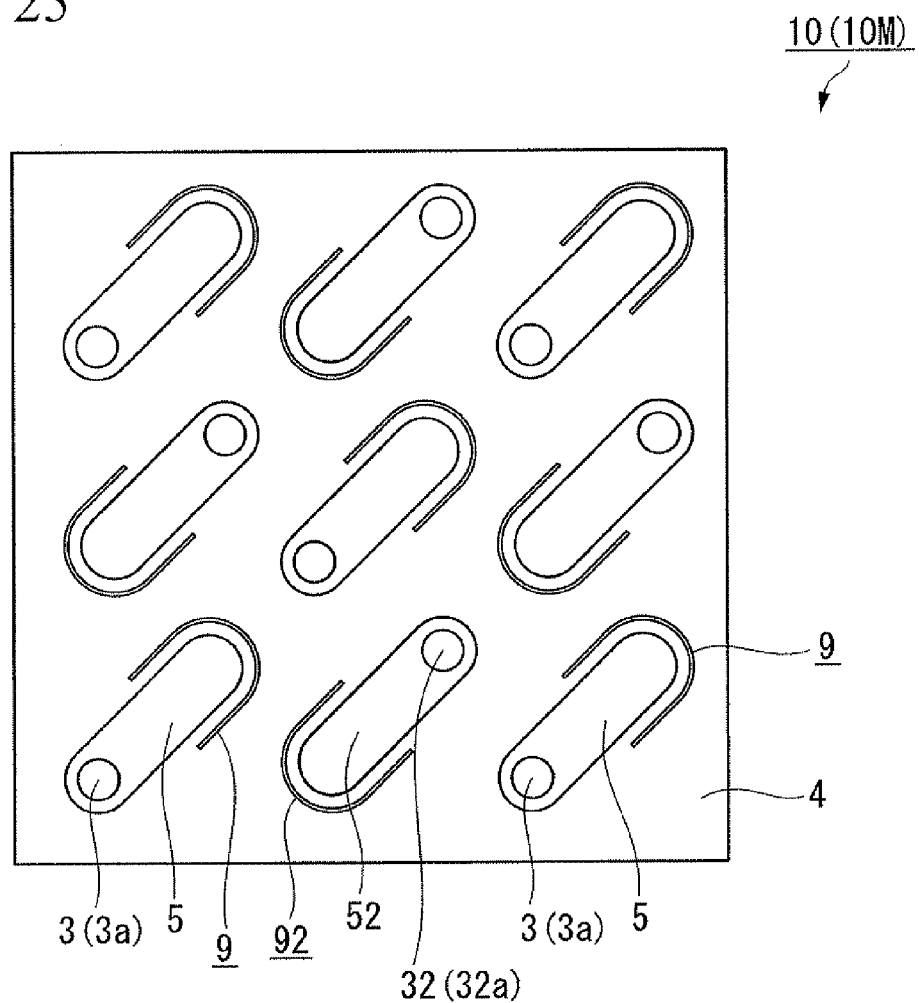
FIG. 25 is a plan view schematically showing one example in which electronic components are mounted by use of the electronic component mounting board according to the embodiment.

FIG. 25 is a plan view schematically showing an electronic component mounting board 10M according to a thirteenth embodiment of the present invention. The difference between the present embodiment and the second embodiment lies in that the electrodes 5 and the slits 9 are arranged in alternating orientations. While in the present embodiment that the electrodes 5 and the slits 9 are arranged in alternating orientations, the electrodes 5 and the slits 9 may be arranged in row-wise alternating orientations. Also in the present embodiment, the structures 6 may be provided on both sides 1a, 1b of the substrate base 1 and a bump portion may be provided on every electrode 5, as is the case with the aforementioned third embodiment to twelfth embodiment. Furthermore, the projection portions 1A may be provided on the substrate 1. It is possible to obtain the advantage similar to that of the aforementioned electronic component mounting board that is obtained in the aforementioned second embodiment to twelfth embodiment.

FIG. 25 shows the electronic component mounting board where the slits 9 are provided in the substrate 4. However, in the case where a required stroke amount is small, the slits 9 may not be provided in the substrate 4 similarly to the case of the first embodiment or the sixth embodiment.

In the electronic component mounting boards 10 (10A to 10M) of the aforementioned first embodiment to thirteenth embodiment, there may be provided recessed portions in the second end 5f sides of the electrodes 5, that is, at contact points with the electronic component 60. As for the recessed portion, its shape is for example a curved surface. However, it is possible to appropriately modify the shape according to the shape of the conductive portion (α, β) of the electronic component and the circuit board that are to be contacted. With the recessed portions being provided in this manner, positioning is made easier when the solder bumps α and the conductive portions β are brought into contact with each other. Therefore, it is possible to improve productivity.

EXAMPLES

Example 1

Through-holes with a 0.5-mm pitch were provided in an 800-µm-thick elastomer made of a silicone rubber to obtain a substrate base shown in FIG. 1B. Next, copper-based conductive pins were cleansed and surface-treated, and then were press-fitted into the through-hole.

After that, a structure where a copper-based circuit was formed on a substrate made of a polyimide was provided on both sides of the elastomer to fabricate an electronic component mounting board shown in FIGS. 8A, 8B. This electronic component mounting board was treated as Example 1.

Comparative Example 1

An anisotropic conductive elastomer sheet as described in Patent Document 1 was used to fabricate a 0.5-mm-pitch electronic component mounting board, which was treated as Comparative Example 1.

Comparative Example 2

Figure 26:
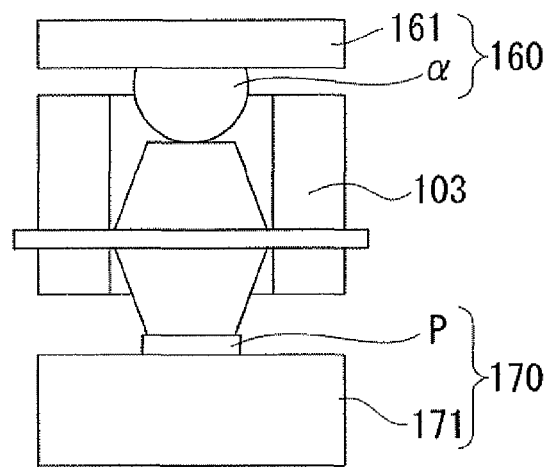
FIG. 26 is a cross-sectional view schematically showing one example a conventional electronic component mounting board.

Conductive elastomer pillars as shown in FIG. 26 were used to fabricate a 1-mm-pitch electronic component mounting board, which was treated as Comparative Example 2.

Comparative Example 3

Figure 27:
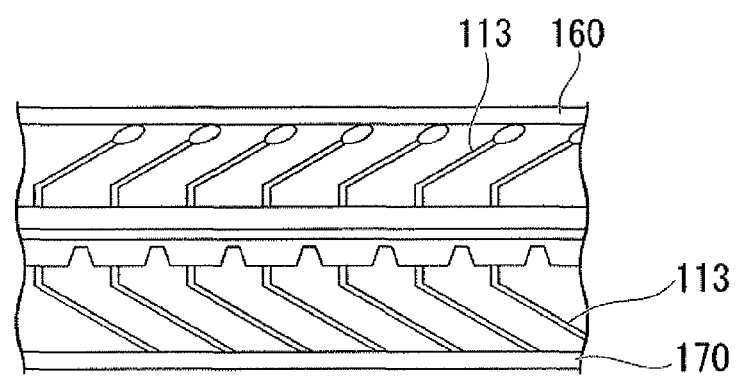
FIG. 27 is a cross-sectional view schematically showing another example a conventional electronic component mounting board.

Blade springs as shown in FIG. 27 were used to fabricate a 1.3-mm-pitch electronic component mounting board, which was treated as Comparative Example 3.

The electronic component mounting boards of Example 1 and Comparative Examples 1 to 3 fabricated as above were used to make a comparison of conductivity and of inductance. The results are shown in Table 1.

A result with high conduction resistance is designated with BAD, and a result in which a sufficiently low conduction resistance was obtained is designated with GOOD. A result in which inductance was above 1.0 nH is designated with BAD, and one in which inductance was 1.0 nH or lower is designated with GOOD.

TABLE 1

|  | Example 1 | Comparative Example 1 | Comparative Example 2 | Comparative Example 3 |
|---|---|---|---|---|
| Pitch | 0.5 mm | 0.5 mm | 1.0 mm | 1.3 mm |
| Inductance | GOOD | GOOD | BAD | BAD |
| Induction Resistance | GOOD | BAD | BAD | GOOD |

Table 1 shows that inductance was above 1.0 nH, hence a large value in Comparative Example 2 where conductive elastomer pillars were used and in Comparative Example 3 where blade springs were used. In contrast to these, inductance showed a value lower than 1.0 nH in Example 1 and Comparative Example 1, thus revealing that these are applicable to a high-frequency electronic component. Furthermore, in Comparative Example 1 where an anisotropic conductive sheet was used and Comparative Example 2 where conductive elastomer pillars were used, a conduction resistance was high. In contrast to these, Example 1 and Comparative Example 4 where blade springs were used were capable of sufficiently lowering conduction resistance.

From above, according to the electronic component mounting board of the present invention, it is possible to lower a conduction resistance and inductance, and also to make a pitch between the terminals narrow.

Example 2

Through-holes with a 0.5-mm pitch were provided in an 800-µm-thick elastomer made of a silicone rubber to obtain a substrate base shown in FIG. 21A. Next, copper-based conductive pins were cleansed and surface-treated, and then were press-fitted into the through-hole.

After that, a structure where a copper-based circuit was formed on a substrate made of a polyimide was provided on both sides of the elastomer to fabricate an electronic component mounting board shown in FIG. 21A. This was treated as Example 2.

The electronic component mounting boards of Example 2 and Comparative Examples 1 to 3 fabricated as above were used to make a comparison of conductivity, of inductance, of a stroke amount, and of a load. The results are shown in Table 2.

A result with high conduction resistance and high contact resistance is designated with BAD, and a result in which a sufficiently low conduction resistance was obtained is designated with GOOD. A result in which inductance was above 1.0 nH is designated with BAD, and one in which inductance was 1.0 nH or lower is designated with GOOD.

TABLE 2

|  | Example 1 | Comparative Example 1 | Comparative Example 2 | Comparative Example 3 |
|---|---|---|---|---|
| Load (gf) | 5 to 50 | 45 | 44 to 71 | 20 to 100 |
| Stroke amount (mm) | 0.2 to 0.5 | 0.36 | 0.31 | 0.30 |
| Minimum distance between terminals (mm) | 0.5 | 0.5 | 1.0 | 1.3 |
| Inductance | GOOD | GOOD | BAD | BAD |
| Induction Resistance | GOOD | BAD | BAD | GOOD |

Table 2 shows that inductance was above 1.0 nH, hence a large value in Comparative Example 2 where conductive elastomer pillars were used and in Comparative Example 3 where blade springs were used. In contrast to these, inductance showed a value lower than 1.0 nH in Example 2 and Comparative Example 1, thus revealing that these are applicable to a high-frequency electronic component. Furthermore, in Comparative Example 1 where an anisotropic conductive sheet was used and Comparative Example 2 where conductive elastomer pillars were used, a conduction resistance was high. In contrast to these, Example 2 and Comparative Example 4 where blade springs were used were capable of sufficiently lowering a conduction resistance.

While in Comparative Examples 1 to 3, the stroke amount was approximately 0.3 to 0.36 mm, Example 2 was capable of offering a stroke amount of 0.2 to 0.5 mm. Furthermore, in contrast to the fact that the load in Comparative Examples 1 to 3 was somewhere within the range of 20 to 100 gf, the load in Example 2 was 5 to 50 gf. That is, according to the electronic component mounting board of Example 2, it has become possible to impose a load with a force smaller than that for conventional ones.

Therefore, the electronic component mounting board of Example 2 is capable of being provided with a wider range of stroke amount and an accurate load, to thereby make it possible to maintain a contact pressure proper even with an electronic component provided with conductive portions different in height. As a result, it is possible to maintain a stable connection state.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. An electronic component mounting board, comprising:
   a substrate base made of flat-plate-like elastomer, the substrate base having a plurality of through-holes in a manner spaced a predetermined distance apart from each other;
   conductive members, each of which has a main unit portion filled in the through-hole, the main unit portion having a first protrusion portion and a second protrusion portion respectively on a first end and a second end thereof, with the first protrusion portion arranged so as to protrude from a first surface of the substrate base and the second protrusion portion arranged so as to protrude from a second surface of the substrate base;
   a flexible substrate that is arranged on the first surface of the substrate base and that has first opening portions for penetration of the first protrusion portions; and
   a plurality of oval electrodes arranged on the flexible substrate, each of which has a second opening portion for penetration of the first protrusion portion, wherein:
   the electrodes are arranged in a manner spaced apart from each other, and each of the second opening portions is formed on a first end side of each of the electrodes.

2. The electronic component mounting board according to claim 1, wherein
   at least the first surface of the substrate base is provided with a plurality of projection portions arranged in a manner spaced a predetermined distance apart from each other;
   the through-hole is arranged between the projection portions;
   the first ends of the main unit portions and top surfaces of the projection portions are on a same virtual plane; and
   the substrate is arranged on the first surface side of the substrate base so as to be in contact with the top surfaces of the projection portions.

3. The electronic component mounting board according to claim 1, wherein
   Slits are arranged in substrate, each along a shape of a second end side of each of the electrodes.

4. The electronic component mounting board according to claim 1, wherein
   a structure made of the electrodes and the substrate is arranged also on a second surface of the substrate base.

5. The electronic component mounting board according to claim 1 or claim 2, wherein
   A bump portion is arranged on a first surface of the electrode and also on a second end side of the electrode.

6. The electronic component mounting board according to claim 1 or claim 2, wherein
   A recessed portion is arranged in a first surface of the electrode and also on a second end side of the electrode.

7. An electronic circuit unit, comprising the electronic component mounting board according to claim 1 or 2.

* * * * *